(12) United States Patent (10) Patent No.: US 12,593,644 B2
Ma et al. (45) Date of Patent: Mar. 31, 2026

(54) CHIP PACKAGING APPARATUS AND TERMINAL DEVICE

(71) Applicant: HUAWEI TECHNOLOGIES CO., LTD., Guangdong (CN)

(72) Inventors: Chao Ma, Shenzhen (CN); Yan Li, Shenzhen (CN); Wenkai Fan, Shenzhen (CN); Shujie Cai, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 747 days.

(21) Appl. No.: 17/533,632

(22) Filed: Nov. 23, 2021

(65) Prior Publication Data

US 2022/0084849 A1 Mar. 17, 2022

Related U.S. Application Data

(63) Continuation of application No. PCT/CN2019/088430, filed on May 24, 2019.

(51) Int. Cl.
*H01L 21/67* (2006.01)
*H01L 23/498* (2006.01)
(Continued)

(52) U.S. Cl.
CPC ..... *H01L 21/67121* (2013.01); *H05K 5/0247* (2013.01); *H01L 23/49816* (2013.01);
(Continued)

(58) Field of Classification Search
CPC ....... H01L 23/49816; H01L 2223/6638; H01L 23/66; H01L 2224/14131;
(Continued)

(56) References Cited

U.S. PATENT DOCUMENTS 9,425,149 B1 8/2016 Jiang et al.
2011/0007487 A1 1/2011 Muraoka
(Continued)

FOREIGN PATENT DOCUMENTS

CN 103872025 A 6/2014
JP 2010192767 A 9/2010
JP 2016127270 A * 7/2016 ............. H01L 22/32

OTHER PUBLICATIONS

Zhang et al, "Investigation of power & ground co-reference for high-speed signal in package design," 2013 IEEE International Symposium on Electromagnetic Compatibility, Denver, CO, USA, 2013, pp. 846-851. (Year: 2013).*
(Continued)

*Primary Examiner* — A. Dexter Tugbang

(57) ABSTRACT

A chip packaging apparatus includes a first differential pin pair, a first pin, and a second pin. The first differential pin pair includes a first differential signal pin and a second differential signal pin. In addition, the first pin and the second pin are both located between the first differential signal pin and the second differential signal pin, and the first pin and the second pin are differential signal pins (or both are power pins). The first pin is adjacent to the first differential signal pin and the second differential signal pin. The second pin is adjacent to the first differential signal pin and the second differential signal pin. The first pin and the second pin are respectively located on two sides of a first imaginary straight line connecting the first differential signal pin to the second differential signal pin.

15 Claims, 24 Drawing Sheets

(51) Int. Cl.
    *H05K 5/02*       (2006.01)
    *H01L 23/00*      (2006.01)
    *H01L 23/66*      (2006.01)

(52) U.S. Cl.
    CPC ........ *H01L 23/49822* (2013.01); *H01L 23/66*
        (2013.01); *H01L 24/00* (2013.01); *H01L 24/16*
        (2013.01); *H01L 2223/6638* (2013.01); *H01L*
            *2224/14131* (2013.01); *H01L 2224/14133*
            (2013.01); *Y10T 29/53178* (2015.01)

(58) Field of Classification Search
    CPC ..... H01L 2224/14133; H01L 21/67121; H01L
        23/49822; H01L 24/00; Y10T 29/53178;
                    H05K 5/0247
    See application file for complete search history.

(56) References Cited

U.S. PATENT DOCUMENTS

2012/0001327 A1*  1/2012  Zhou ................. H01L 23/49816
                                     257/E23.021
2016/0134262 A1    5/2016  Masleid et al.

OTHER PUBLICATIONS

International Search and Written Opinion issued in PCT/CN2019/088430, dated Feb. 24, 2020, 10 pages.
Office Action issued in CN201980087057.0, dated Jan. 5, 2023, 5 pages.
Office Action for Chinese Application No. 201980087057.0 dated Apr. 22, 2022, 7 pages.

* cited by examiner

300

32a

30

31

A     B

322a

O1     O1

321a

311 {

321b

322b

H1

A     B

① (5°)
② (10°)
③ (15°)
④ (20°)
⑤ (25°)
⑥ (30°)
⑦ (35°)
⑧ (40°)

Frequency (GHz)

Differential-mode insertion loss (dB)

20

Frequency (GHz)

Far-end crosstalk (dB)

CHIP PACKAGING APPARATUS AND TERMINAL DEVICE

CROSS-REFERENCE TO RELATED APPLICATIONS

This application is a continuation of International Application No. PCT/CN2019/088430, filed on May 24, 2019, the disclosure of which is hereby incorporated by reference in its entirety.

TECHNICAL FIELD

This application relates to the field of microelectronics technologies, and in particular, to a chip packaging apparatus and a terminal device.

BACKGROUND

Because a differential signal has a high anti-noise capability and immunity to crosstalk, the differential signal is increasingly used as a signal transmission mode in a microelectronic product.

To transmit the differential signal between a chip and an external component of the microelectronic product, differential signal transmission may be performed using a differential pin pair 100 shown in FIG. 1a. Each differential pin pair 100 includes two differential signal pins 101. In addition, ground pins 200 may be used around each differential pin pair 100 for isolation. This can reduce a probability of crosstalk generated between differential signals transmitted by two adjacent differential pin pairs 100, and ensure integrity of differential signals transmitted by each differential pin pair 100.

Therefore, the ground pins 200 need to be disposed on the top, bottom, left, and right of any differential pin pair 100 to isolate two adjacent differential pin pairs 100. Therefore, a large quantity of ground pins 200 need to be disposed between the chip and the external component electrically connected to the chip. To accommodate other signal pins or power pins, a package size of the chip needs to be further increased. Therefore, it is difficult to implement a miniaturization design of the microelectronic product.

SUMMARY

Embodiments of this application provide a chip packaging apparatus and a terminal device, to increase a quantity of signal pins or power pins in limited component space.

To achieve the foregoing objective, the following technical solutions are used in the embodiments of this application.

According to one aspect, an embodiment of this application provides a chip packaging apparatus. The chip packaging apparatus includes a first differential pin pair, a first pin, and a second pin. The first differential pin pair includes a first differential signal pin and a second differential signal pin. In addition, the first pin and the second pin are both located between the first differential signal pin and the second differential signal pin, and the first pin and the second pin are differential signal pins or both are power pins. The first pin is adjacent to the first differential signal pin and the second differential signal pin. The second pin is adjacent to the first differential signal pin and the second differential signal pin. The first pin and the second pin are respectively located on two sides of a first imaginary straight line connecting the first differential signal pin to the second differential signal pin.

In this case, a zero potential plane that overlaps a plane of symmetry of the first differential signal pin and the second differential signal pin is formed under excitation of a differential signal transmitted on the first differential signal pin and the second differential signal pin. The first pin and the second pin are disposed between the first differential signal pin and the second differential signal pin, such that the first pin and the second pin can be located close to or located in positions on the zero potential plane. This can reduce a probability that the first differential pin pair, the first pin, and the second pin form a resonant circuit, and reduce adverse impact of a voltage between the first pin and the second pin on the differential signal transmitted by the first differential pin pair.

Optionally, the first pin and the second pin are symmetrical about a point of symmetry of the first differential signal pin and the second differential signal pin. In this case, a distance from the first pin to the point of symmetry is the same as a distance from the second pin to the point of symmetry. This can reduce a probability that the first differential pin pair, the first pin, and the second pin form a resonant circuit.

Optionally, the first pin and the second pin are symmetrically disposed about the first imaginary straight line. In this case, a distance from the first pin to the first imaginary straight line is the same as a distance from the second pin to the first imaginary straight line. This can reduce a probability that the first differential pin pair, the first pin, and the second pin form a resonant circuit.

Optionally, a first included angle $\gamma1$ exists between a second imaginary straight line connecting the first pin to the point of symmetry of the first differential signal pin and the second differential signal pin and the plane of symmetry of the first differential signal pin and the second differential signal pin, and the first included angle $\gamma1$ is 0° to 45°. In addition, a second included angle $\gamma2$ exists between a third imaginary straight line connecting the second pin to the point of symmetry and the plane of symmetry of the first differential signal pin and the second differential signal pin, and the second included angle $\gamma2$ is 0° to 45°. In a frequency range of 0 GHz to 30 GHz, a resonance phenomenon of a differential-mode insertion loss of the first differential pin pair becomes more obvious when the first included angle $\gamma1$ and the second included angle $\gamma2$ are larger. In addition, the resonance phenomenon is related to a frequency. For example, when the frequency is in a range of 0 GHz to 15 GHz and the first included angle $\gamma1$ and the second included angle $\gamma2$ are in a range of 0° to 45°, changes of all differential-mode insertion loss curves of the first differential pin pair are similar, the resonance phenomenon is not obvious, and performance of a terminal device having the chip packaging apparatus is not greatly affected. In addition, in the range of 0° to 45°, when the first included angle $\gamma1$ and the second included angle $\gamma2$ are smaller, for example, are 5°, 10° or 15°, a differential-mode insertion loss curve of the first differential pin pair corresponding to the foregoing angle changes slowly, and a probability that a resonance phenomenon is caused is low. Therefore, in some embodiments of this application, the first included angle $\gamma1$ and the second included angle $\gamma2$ may be 5°, 10°, or 15°.

Optionally, the first pin and the second pin are located in positions on the plane of symmetry of the first differential signal pin and the second differential signal pin. In this way, the zero potential plane between the first differential signal pin and the second differential signal pin passes through centers of the first pin and the second pin. This can minimize a probability that the first differential pin pair, the first pin, and the second pin form a resonant circuit.

Optionally, the chip packaging apparatus further includes a chip. The first differential pin pair, the first pin, and the second pin are electrically connected to the chip. Because the first pin and the second pin may be pins configured to transmit a differential signal or a supply voltage, when a size of an area in which the pins are disposed on the chip is limited, a quantity of differential signal pins or power pins can be increased. This helps reduce a size of the chip.

Optionally, the chip packaging apparatus further includes a chip and a packaging substrate, where the chip is electrically connected to the packaging substrate; and the first differential pin pair, the first pin, and the second pin are located on one side of the packaging substrate away from the chip. Because the first pin and the second pin may be pins configured to transmit a differential signal or a supply voltage, when a size of an area in which the pins are disposed on the packaging substrate is limited, a quantity of differential signal pins or power pins can be increased. This helps reduce a size of the packaging substrate.

Optionally, the packaging substrate includes at least one insulation layer, a first differential line electrically connected to the first differential signal pin, a second differential line electrically connected to the second differential signal pin, a first line electrically connected to the first pin, and a second line electrically connected to the second pin. At least one insulation layer exists between the first line and the first differential line and between the first line and the second differential line. Therefore, lines of the first pin, the first differential signal pin, and the second differential signal pin are led out from different layers in the packaging substrate, and adverse impact of the first pin on the differential signal of the first differential pin pair is reduced. In addition, at least one insulation layer exists between the second line and the first differential line and between the second line and the second differential line. Therefore, lines of the second pin, the first differential signal pin, and the second differential signal pin are led out from different layers in the packaging substrate, and adverse impact of the second pin on the differential signal of the first differential pin pair is reduced.

Optionally, a spacing between the adjacent first pin and first differential signal pin, a spacing between the adjacent first pin and second differential signal pin, a spacing between the adjacent second pin and first differential signal pin, a spacing between the adjacent second pin and second differential signal pin, and a spacing between the adjacent first differential signal pin and second differential signal pin are equal.

On this basis, optionally, the chip packaging apparatus further includes a packaging substrate. The packaging substrate includes a first differential via electrically connected to the first differential signal pin and a second differential via electrically connected to the second differential signal pin. The packaging substrate further includes a ground plane. An anti-pad of the first differential via and an anti-pad of the second differential via on the ground plane are interconnected. In this way, an anti-pad of the first via on the ground plane and an anti-pad of the second via on the ground plane can be separated by the interconnected anti-pads. Further, an objective of isolating the first differential pin pair from the first pin and the second pin is achieved.

Optionally, the chip packaging apparatus includes a plurality of pins arranged in an array. The plurality of pins arranged in the array include the first pin, the first differential signal pin, the second differential signal pin, and the second pin. The first pin is located in an $N^{th}$ row and an $M^{th}$ column, where $N \geq 1$, $M \geq 2$, and N and M are positive integers. The first differential signal pin is located in an $(N+1)^{th}$ row and an $(M-1)^{th}$ column. The second differential signal pin is located in the $(N+1)^{th}$ row and an $(M+1)^{th}$ column. The second pin is located in an $(N+2)^{th}$ row and the $M^{th}$ column. In this case, connection lines between a center of the first pin, a center of the first differential signal pin, and a center of the second differential signal pin form an isosceles triangle. Connection lines between a center of the second pin, the center of the first differential signal pin, and the center of the second differential signal pin form an isosceles triangle. A spacing between the first differential signal pin and the second differential signal pin is less than a spacing between the first pin and the second pin. Therefore, pin component space of the chip packaging apparatus can be saved by reducing the spacing between the first differential signal pin and the second differential signal pin. In addition, the plurality of pins arranged in the array further include a third differential signal pin, a fourth differential signal pin, a third pin, and a fourth pin. Both the third pin and the fourth pin are located between the third differential signal pin and the fourth differential signal pin. The third pin and the fourth pin are differential signal pins or both are power pins. The third pin is adjacent to the third differential signal pin and the fourth differential signal pin. The fourth differential pin is adjacent to the third differential signal pin and the fourth differential signal pin. The third pin and the fourth pin are respectively located on two sides of a fourth imaginary straight line connecting the third differential signal pin to the fourth differential signal pin. The third pin is located in an $(N+3)^{th}$ row and an $(M+3)^{th}$ column. The third differential signal pin is located in an $(N+4)^{th}$ row and an $(M+2)^{th}$ column. The fourth differential signal pin is located in the $(N+4)^{th}$ row and an $(M+4)^{th}$ column. The fourth pin is located in an $(N+5)^{th}$ row and the $(M+3)^{th}$ column. Likewise, a spacing between the third differential signal pin and the fourth differential signal pin is less than a spacing between the third pin and the fourth pin. The plurality of pins arranged in the array further include a ground pin located in the $(N+2)^{th}$ row and the $(M+2)^{th}$ column, and a ground pin located in the $(N+3)^{th}$ row and the $(M+1)^{th}$ column. The ground pin can isolate the second pin from the third differential signal pin in a same pin assembly, thereby reducing signal crosstalk.

Optionally, the chip packaging apparatus includes a plurality of pins arranged in an array. The plurality of pins arranged in the array include the first pin, the first differential signal pin, the second differential signal pin, and the second pin. The first pin is located in an $N^{th}$ row and an $M^{th}$ column, where $N \geq 1$, $M \geq 2$, and N and M are positive integers. The first differential signal pin is located in an $(N+1)^{th}$ row and an $(M-1)^{th}$ column. The second differential signal pin is located in the $(N+1)^{th}$ row and an $(M+1)^{th}$ column. The second pin is located in an $(N+2)^{th}$ row and the $M^{th}$ column. As described above, a spacing between the first differential signal pin and the second differential signal pin is less than a spacing between the first pin and the second pin. Therefore, the spacing between the first differential signal pin and the second differential signal pin is reduced. In addition, the plurality of pins arranged in the array further include a third differential signal pin, a fourth differential signal pin, a third pin, and a fourth pin. Both the third pin and the fourth pin are located between the third differential signal pin and the fourth differential signal pin. The third pin and the fourth pin are differential signal pins or both are power pins. The third pin is adjacent to the third differential signal pin and the fourth differential signal pin. The fourth differential pin is adjacent to the third differential signal pin and the fourth differential signal pin. The third pin and the fourth pin are respectively located on two sides of a fourth imaginary straight line connecting the third differential signal pin to the fourth differential signal pin. The third pin is located in the $(N+2)^{th}$ row and an $(M+4)^{th}$ column. The third differential signal pin is located in an $(N+3)^{th}$ row and an $(M+3)^{th}$ column. The fourth differential signal pin is located in the $(N+3)^{th}$ row and an $(M+5)^{th}$ column. The fourth pin is located in an $(N+4)^{th}$ row and the $(M+4)^{th}$ column. Likewise, a spacing between the third differential signal pin and the fourth differential signal pin is less than a spacing between the third pin and the fourth pin. In addition, because the third differential signal pin and the second pin in the same pin assembly are located in the same row, a spacing between the third differential signal pin and the second pin in the same pin assembly can be reduced, to save pin component space in the chip packaging apparatus. In addition, the plurality of pins arranged in the array further include a ground pin located in the $(N+2)^{th}$ row and an $(M+2)^{th}$ column. The ground pin can isolate the second differential signal pin from the third differential signal pin, and the second pin from the third pin in the same pin assembly, thereby reducing signal crosstalk.

Optionally, a spacing between the adjacent first pin and first differential signal pin, a spacing between the adjacent first differential signal pin and the second pin, a spacing between the adjacent second pin and the second differential signal pin, and a spacing between the adjacent second differential signal pin and first pin are equal. In this way, connection lines between centers of the first pin, the first differential signal pin, the second pin, and the second differential signal pin may form a rectangle. Therefore, the pin assembly including the first pin, the first differential signal pin, the second pin, and the second differential signal pin is applicable to a ball grid array arranged in a rectangle.

Optionally, the chip packaging apparatus includes a plurality of pins arranged in an array. The plurality of pins arranged in the array include the first pin, the first differential signal pin, the second differential signal pin, and the second pin. The first pin is located in an $N^{th}$ row and an $M^{th}$ column, where N≥1, M≥2, and N and M are positive integers. The first differential signal pin is located in an $(N+1)^{th}$ row and an $(M-1)^{th}$ column. The second differential signal pin is located in the $(N+1)^{th}$ row and an $(M+1)^{th}$ column. The second pin is located in an $(N+2)^{th}$ row and the $M^{th}$ column. The first pin and the second pin are ground pins. The plurality of pins arranged in the array further include a third differential signal pin and a fourth differential signal pin, where the second pin is located between the third differential signal pin and the fourth differential signal pin and is adjacent to the third differential signal pin and the fourth differential signal pin. The third differential signal pin is located in an $(N+3)^{th}$ row and the $(M-1)^{th}$ column. The fourth differential signal pin is located in the $(N+3)^{th}$ row and the $(M+1)^{th}$ column. In this case, when the first pin and the second pin are located on the zero potential plane formed by the differential signal of the first differential pin pair, the first pin and the second pin are also located on a zero potential plane formed by a differential signal of a third differential pin pair. Therefore, adverse impact of the second pin close to the third differential pin pair on the differential signal of the third differential pin pair formed by the third differential signal pin and the fourth differential signal pin can be reduced. In addition, the first differential pin pair and the third differential pin pair are separated only by the second pin. Therefore, a quantity of differential pin pairs disposed in the chip packaging apparatus can be increased.

According to another aspect, an embodiment of this application provides a terminal device, including a printed circuit board and any one of the foregoing chip packaging apparatuses. The printed circuit board is electrically connected to the chip packaging apparatus. The terminal device can have a same technical effect as the chip packaging apparatus provided in the foregoing embodiment.

BRIEF DESCRIPTION OF DRAWINGS

FIG. 2b is an example schematic diagram of a structure of a chip packaging apparatus in FIG. 2a;

FIG. 3b is an example schematic diagram of a zero potential plane formed between a pair of differential signal pins in FIG. 3a;

FIG. 5b is an example schematic diagram of interconnection between anti-pads of two tightly coupled pins in FIG. 5a;

FIG. 5c is an example schematic diagram of isolation between anti-pads of two tightly coupled pins in FIG. 5a;

REFERENCE SIGNS

01: terminal device; 100: differential pin pair; 101: differential signal pin; 200: ground pin; 10: display screen; 11: middle frame; 12: housing; 300: chip packaging apparatus; 30: chip; 31: packaging substrate; 32: pin; 311: first differential pin pair; 321*a*: first differential signal pin; 321*b*: second differential signal pin; 312: second differential pin pair; 322*a*: first pin; 322*b*: second pin; 13: line; 14: adhesive layer; 302*a*: first differential line; 302*b*: second differential line; 303*a*: first line; 303*b*: second line; 40*a*: first differential via; 40*b*: second differential via; 41*a*: first via; 41*b*: second via; 201: ground plane; 202: anti- pad; 20: pin assembly; 313: third differential pin pair; 323*a*: third differential signal pin; 323*b*: fourth differential signal pin; 324*a*: third pin; 324*b*: fourth pin; and 50: via.

DESCRIPTION OF EMBODIMENTS

The following describes the technical solutions in the embodiments of this application with reference to the accompanying drawings in the embodiments of this application. It is clear that the described embodiments are merely some but not all of the embodiments of this application.

The terms "first" and "second" in this specification are merely intended for a purpose of description, and shall not be understood as an indication or implication of relative importance or implicit indication of a quantity of indicated technical features. Therefore, a feature limited by "first" or "second" may explicitly or implicitly include one or more features. In the description of this application, unless otherwise stated, "a plurality of" means two or more than two.

In addition, in this application, position terms such as "top" and "bottom" are defined relative to positions of components in the accompanying drawings. It should be understood that these position terms are relative concepts used for relative description and clarification, and may correspondingly change according to changes in the positions of the components in the accompanying drawings.

An embodiment of this application provides a terminal device. The terminal device includes, for example, a mobile phone, a tablet computer, a personal digital assistant (PDA), a vehicle-mounted computer, or an intelligent wearable product. A form of the terminal device is not specially limited in this embodiment of this application. For ease of description, the following uses an example in which the terminal device is a mobile phone for description.

Figure 2A:
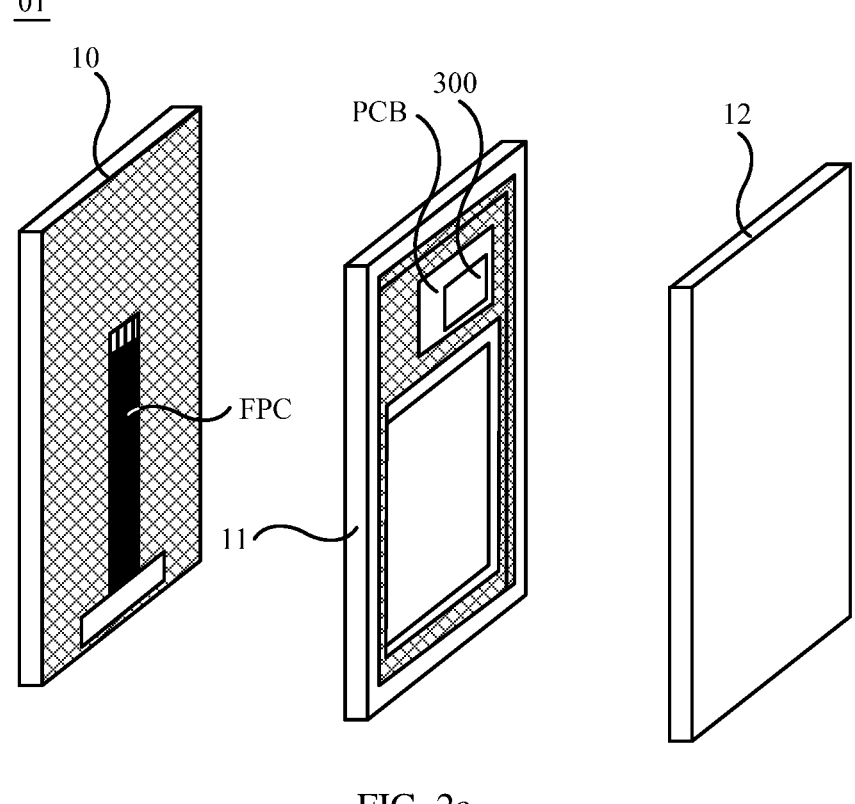
FIG. 2a is an example schematic diagram of a structure of a terminal device according to this application.

In this case, as shown in FIG. 2*a*, the terminal device 01 mainly includes a display screen 10, a middle frame 11, and a housing 12. After being connected to the middle frame 11, the display screen 10 is disposed in the housing 12.

Figure 2B:
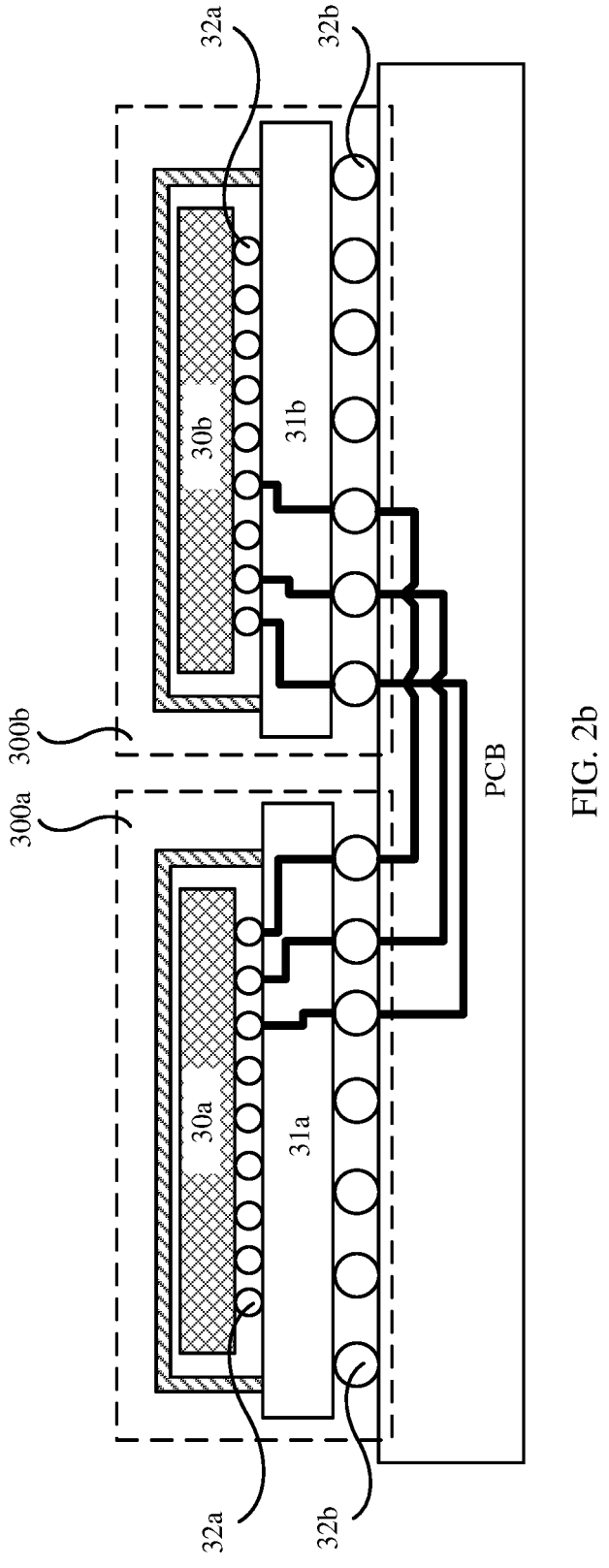

The terminal device 01 may further include a printed circuit board (PCB) disposed on a surface of one side of the middle frame 11 facing the housing 12, and at least one chip packaging apparatus 300 electrically connected to the PCB. In FIG. 2*b* (a cross-sectional view of the chip packaging apparatus 300), the PCB and two chip packaging apparatuses that are respectively a first chip packaging apparatus 300*a* and a second chip packaging apparatus 300*b* are used as an example for description.

The first chip packaging apparatus 300*a* includes a first chip 30*a*. The second chip packaging apparatus 300*b* includes a second chip 30*b*. The first chip 30*a* and the second chip 30*b* can implement data processing or storage.

The PCB is electrically connected to a flexible printed circuit (FPC) on the back of the display screen 10 in FIG. 2*a*. Therefore, data processed or stored by the first chip packaging apparatus 300*a* and the second chip packaging apparatus 300*b* can be provided to the display screen 10 using the PCB, such that the display screen 10 displays a picture.

In some embodiments of this application, to enable the first chip 30*a* and the second chip 30*b* to be electrically connected to the PCB, as shown in FIG. 2*b*, the first chip packaging apparatus 300*a* further includes a first packaging substrate 31*a*, a plurality of first-level pins 32*a* located between the first chip 30*a* and the first packaging substrate 31*a*, and a plurality of second-level pins 32*b* located between the first packaging substrate 31*a* and the PCB.

In this way, the first chip 30*a* is electrically connected to the first packaging substrate 31*a* using the plurality of first-level pins 32*a* located below the first chip 30*a*. The first packaging substrate 31*a* is electrically connected to the PCB using the plurality of second-level pins 32*b* located below the first packaging substrate 31*a*, such that signal transmission is implemented between the first chip 30*a* and the PCB.

Likewise, the second chip packaging apparatus 300*b* further includes a second packaging substrate 31*b*, a plurality of first-level pins 32*a* located between the second chip 30*b* and the second packaging substrate 31*b*, and a plurality of second-level pins 32*b* located between the second packaging substrate 31*a* and the PCB.

In this way, the second chip 30*b* is electrically connected to the second packaging substrate 31*b* using the plurality of first-level pins 32*a* located below the second chip 30*b*. The second packaging substrate 31*b* is electrically connected to the PCB using the plurality of second-level pins 32*b* located below the second packaging substrate 31*b*, such that signal transmission is implemented between the second chip 30*b* and the PCB.

It should be noted that the first-level pin 32*a* is a lead-out end configured to lead out an internal circuit of the chip in the chip packaging apparatus. For example, the first-level pin 32*a* may be a lead-out end configured to lead out an internal circuit of the first chip 30*a* in the first chip packaging apparatus 300*a*. The lead-out end is electrically connected to the first packaging substrate 31*a*. The lead-out end may also be referred to as an interface.

The second-level pin 32b is a lead-out end configured to lead out an internal circuit of the packaging substrate in the chip packaging apparatus. For example, the second-level pin 32b may be a lead-out end configured to lead out an internal circuit of the first packaging substrate 31a in the first chip packaging apparatus 300a. The lead-out end is electrically connected to the PCB. The lead-out end may also be referred to as an interface.

In this embodiment of this application, the first-level pin 32a and the second-level pin 32b may be solder bumps, solder balls, or copper pillars.

Figure 2C:
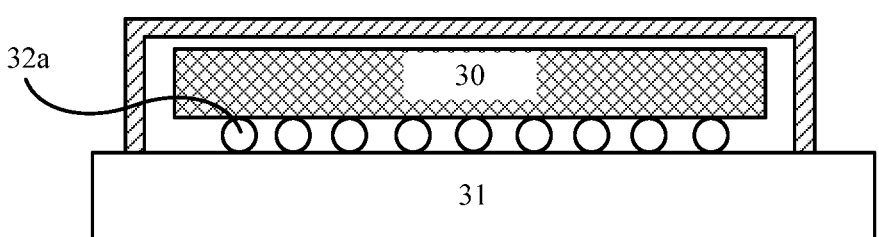
FIG. 2c is an example schematic diagram of a partial structure of either of chip packaging apparatuses shown in FIG. 2b.

The following uses either of the first chip packaging apparatus 300a and the second chip packaging apparatus 300b as an example to describe a manner of disposing the plurality of first-level pins 32a on a lower surface (a surface facing the packaging substrate 31) of the chip 30 in the chip packaging apparatus 300, as shown in FIG. 2c (a cross-sectional view of the chip packaging apparatus).

Figure 3A:
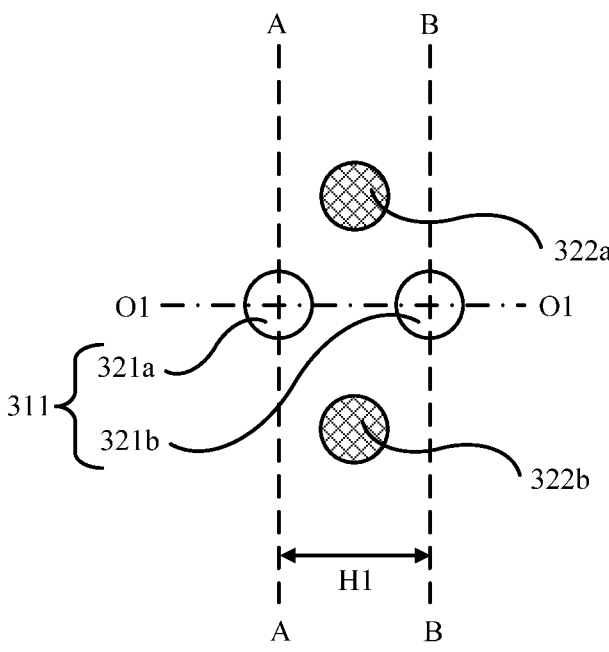
FIG. 3a is an example schematic diagram of an arrangement of a plurality of pins located on a same side of a packaging substrate in FIG. 2c.

The plurality of first-level pins 32a, as shown in FIG. 3a (vertical projection of the plurality of first-level pins 32a on the lower surface of the chip 30), include a first differential signal pin 321a, a second differential signal pin 321b, a first pin 322a, and a second pin 322b.

The first differential signal pin 321a and the second differential signal pin 321b constitute a first differential pin pair 311 for transmitting a differential signal.

For example, when the first differential pin pair 311 transmits the differential signal, the first differential signal pin 321a may be a positive electrode and has a first voltage V1. The second differential signal pin 321b may be a negative electrode and has a second voltage V2. In this case, the differential signal transmitted on the first differential pin pair 311 is $V_{diff}=V1-V2$.

The first pin 322a and the second pin 322b are both located between the first differential signal pin 321a and the second differential signal pin 321b.

It should be noted that, as shown in FIG. 3a, a first imaginary auxiliary straight line A-A passes through a center of the first differential signal pin 321a and is perpendicular to a first imaginary straight line O1-O1. A second imaginary auxiliary straight line B-B passes through a center of the second differential signal pin 321b and is perpendicular to the first imaginary straight line O1-O1.

The first imaginary straight line O1-O1 is used to connect the first differential signal pin 321a to the second differential signal pin 321b.

It should be noted that, in this application, that the first imaginary straight line O1-O1 is used to connect the first differential signal pin 322a to the second differential signal pin 322b means that one end of the first imaginary straight line O1-O1 extends to the center of the first differential signal pin 322a and the other end extends to the center of the second differential signal pin 322b.

In this case, a spacing H1 between the first imaginary auxiliary straight line A-A and the second imaginary auxiliary straight line B-B is equal to a spacing between the first differential signal pin 321a and the second differential signal pin 321b (a distance between the center of the first differential signal pin 321a and the center of the second differential signal pin 321b).

Based on this, that the first pin 322a is located between the first differential signal pin 321a and the second differential signal pin 321b means that at least a part of the first pin 322a may be located between the first imaginary auxiliary straight line A-A and the second imaginary auxiliary straight line B-B. Likewise, that the second pin 322b is located between the first differential signal pin 321a and the second differential signal pin 321b means that at least a part of the second pin 322b may be located between the first imaginary auxiliary straight line A-A and the second imaginary auxiliary straight line B-B.

In addition, as shown in FIG. 3a, on a basis that the first pin 322a and the second pin 322b are located between the first imaginary auxiliary straight line A-A and the second imaginary auxiliary straight line B-B, the first pin 322a is adjacent to the first differential signal pin 321a and the second differential signal pin 321b. The second pin 322b is adjacent to the first differential signal pin 321a and the second differential signal pin 321b.

In addition, the first pin 322a and the second pin 322b are respectively located on two sides of the first differential pin pair 311, that is, the first pin 322a and the second pin 322b are respectively located on two sides of the first imaginary straight line O1-O1.

Figure 3B:
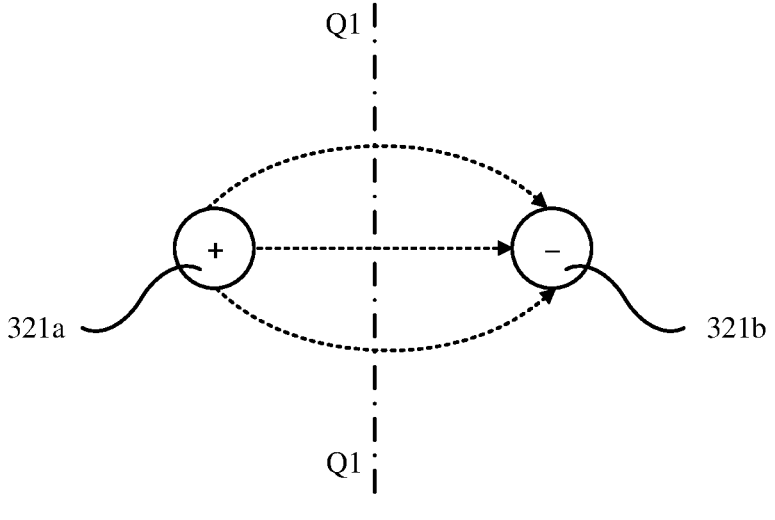

A zero potential plane Q1-Q1 that is shown in FIG. 3b and overlaps a plane of symmetry of the first differential signal pin 321a and the second differential signal pin 321b is formed under excitation of the differential signal transmitted on the first differential signal pin 321a and the second differential signal pin 321b.

In this case, the first pin 322a and the second pin 322b are disposed between the first differential signal pin 321a and the second differential signal pin 321b, such that the first pin 322a and the second pin 322b can be located close to or located in positions on the zero potential plane Q1-Q1. This can reduce a probability that the first differential pin pair 311, the first pin 322a, and the second pin 322b form a resonant circuit, and reduce adverse impact of a voltage between the first pin 322a and the second pin 322b on the differential signal transmitted by the first differential pin pair 311.

A manner of disposing the first pin 322a and the second pin 322b close to or on the zero potential plane Q1-Q1 is hereinafter described using an example on a basis that the first pin 322a and the second pin 322b are located between the first differential signal pin 321a and the second differential signal pin 321b and that the first pin 322a and the second pin 322b are located on two sides of the first imaginary straight line O1-O1.

Figure 3C:
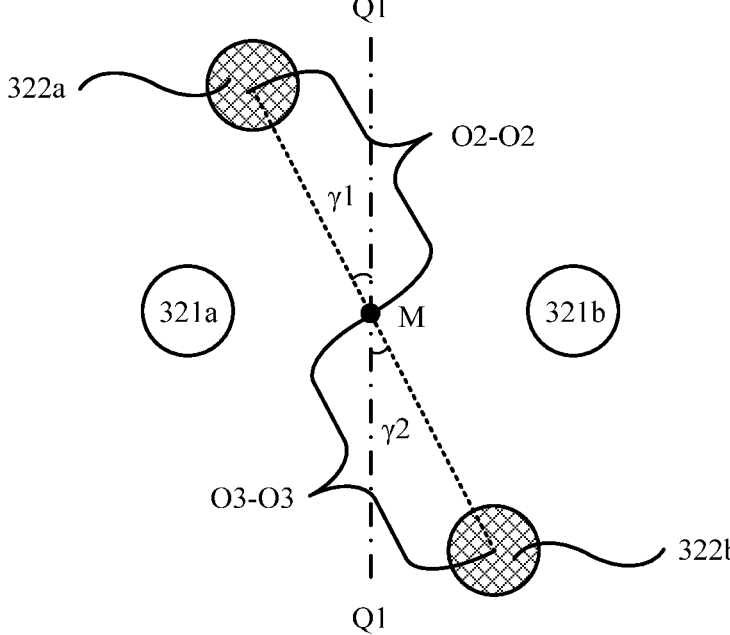
FIG. 3c is an example schematic diagram of another arrangement of a plurality of pins located on a same side of a packaging substrate in FIG. 2c.

In some embodiments of this application, for example, as shown in FIG. 3c, the first pin 322a and the second pin 322b are symmetrical about a point M of symmetry of the first differential signal pin 321a and the second differential signal pin 321b. In this case, a distance from the first pin 322a to the point M of symmetry is the same as a distance from the second pin 322b to the point M of symmetry. Therefore, a probability that the first differential pin pair 311, the first pin 322a, and the second pin 322b form a resonant circuit is reduced.

On this basis, to make the first pin 322a and the second pin 322b close to the zero potential plane Q1-Q1, as shown in FIG. 3c, a first included angle γ1 exists between a second imaginary straight line O2-O2 connecting the first pin 322a to the point M of symmetry and the zero potential plane Q1-Q1. The first included angle γ1 is 0° to 45°.

In addition, a second included angle γ2 exists between a third imaginary straight line O3-O3 connecting the second pin 322b to the point M of symmetry and the zero potential plane Q1-Q1. The second included angle γ2 is 0° to 45°.

Figure 3D:
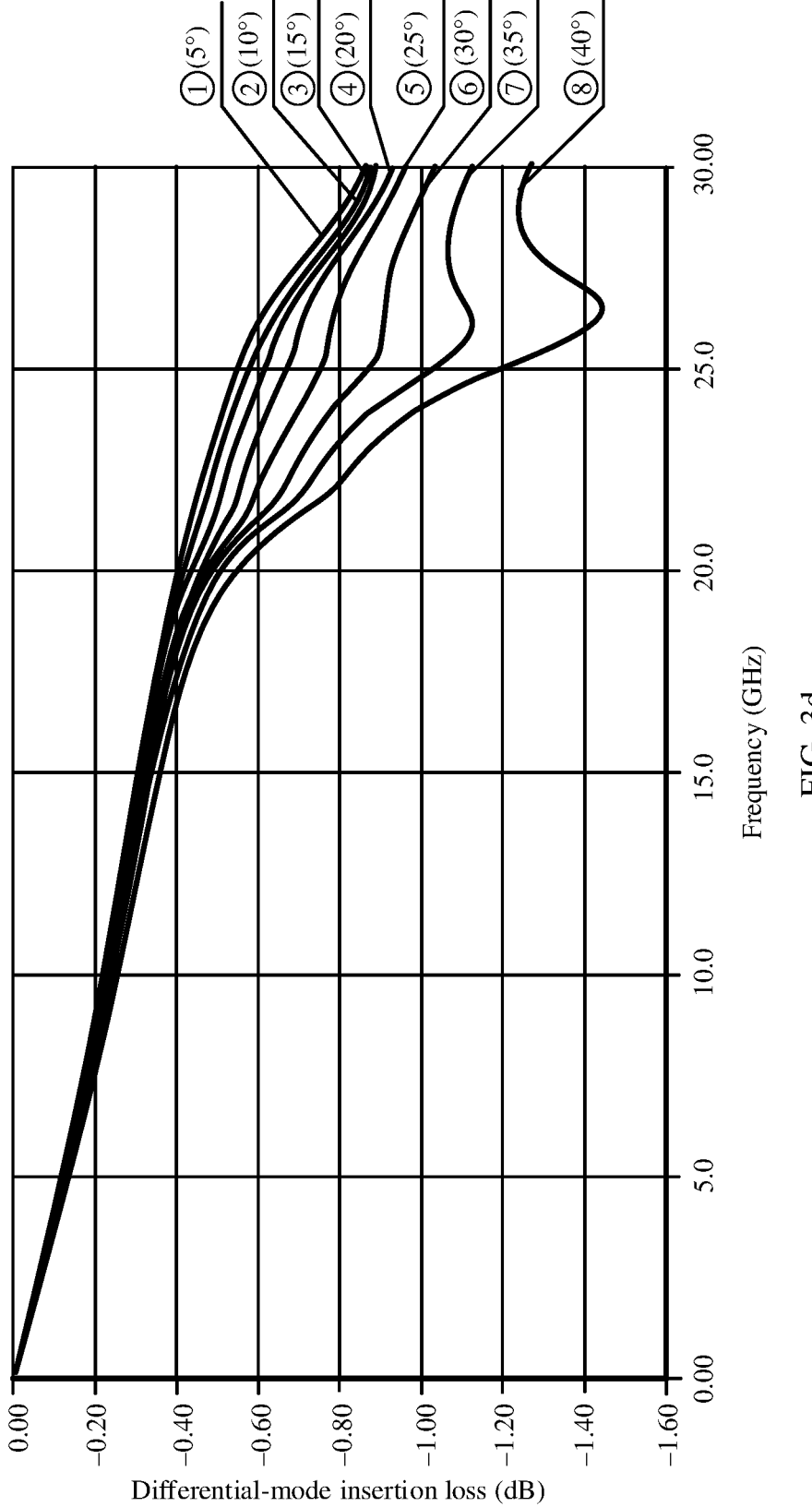
FIG. 3d is an example differential-mode insertion loss curve of a differential pin pair in the pin arrangement in FIG. 3c.

When the first pin 322a and the second pin 322b are symmetrical about the point M of symmetry of the first differential signal pin 321a and the second differential signal pin 321b, the first included angle γ1 and the second included angle γ2 are equal. In this case, eight curves in FIG. 3d are respectively differential-mode insertion loss curves of the first differential pin pair 311 when the first included angle γ1 and the second included angle γ2 are 5°, 10°, 15°, 20°, 25°, 30°, 35°, and 40° sequentially. In FIG. 3d, a horizontal coordinate is a frequency, and a vertical coordinate is a differential-mode insertion loss. As can be learned from FIG. 3d, in a frequency range of 0 GHz to 30 GHz, a resonance phenomenon of the differential-mode insertion loss of the first differential pin pair 311 becomes more obvious when the first included angle γ1 and the second included angle γ2 are larger.

In addition, the resonance phenomenon is related to a frequency. For example, when the frequency is in a range of 0 GHz to 15 GHz and the first included angle γ1 and the second included angle γ2 are in a range of 0° to 45°, changes of all differential-mode insertion loss curves of the first differential pin pair 311 are similar, the resonance phenomenon is not obvious, and performance of a terminal device having the chip packaging apparatus 300 is not greatly affected.

In addition, as can be learned from FIG. 3d, in the range of 0° to 45°, when the first included angle γ1 and the second included angle γ2 are smaller, for example, are 5°, 10° or 15°, a differential-mode insertion loss curve of the first differential pin pair 311 corresponding to the foregoing angle changes slowly, and a probability that a resonance phenomenon is caused is low. Therefore, in some embodiments of this application, the first included angle γ1 and the second included angle γ2 may be 5°, 10°, or 15°.

Figure 3E:
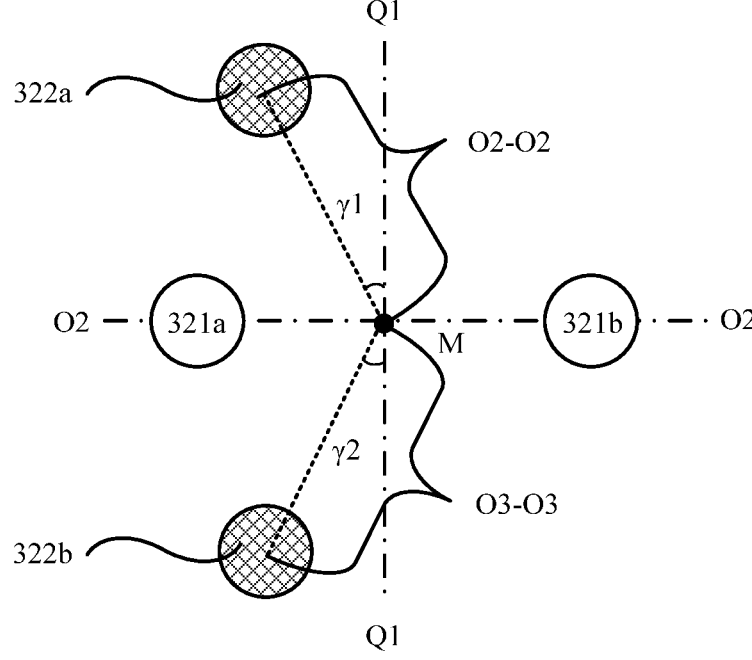
FIG. 3e is an example schematic diagram of another arrangement of a plurality of pins located on a same side of a packaging substrate in FIG. 2c.

Alternatively, in some embodiments of this application, for another example, as shown in FIG. 3e, the first pin 322a and the second pin 322b are symmetrically disposed about the first imaginary straight line O1-O1. In this case, a distance from the first pin 322a to the first imaginary straight line O1-O1 is the same as a distance from the second pin 322b to the first imaginary straight line O1-O1. This reduces a probability that the first differential pin pair 311, the first pin 322a, and the second pin 322b form a resonant circuit.

On this basis, to make the first pin 322a and the second pin 322b close to the zero potential plane Q1-Q1, as described above, in FIG. 3e, the first included angle γ1 and the second included angle γ2 are 0° to 45°. The first included angle γ1 is the same as the second included angle γ2.

Figure 3F:
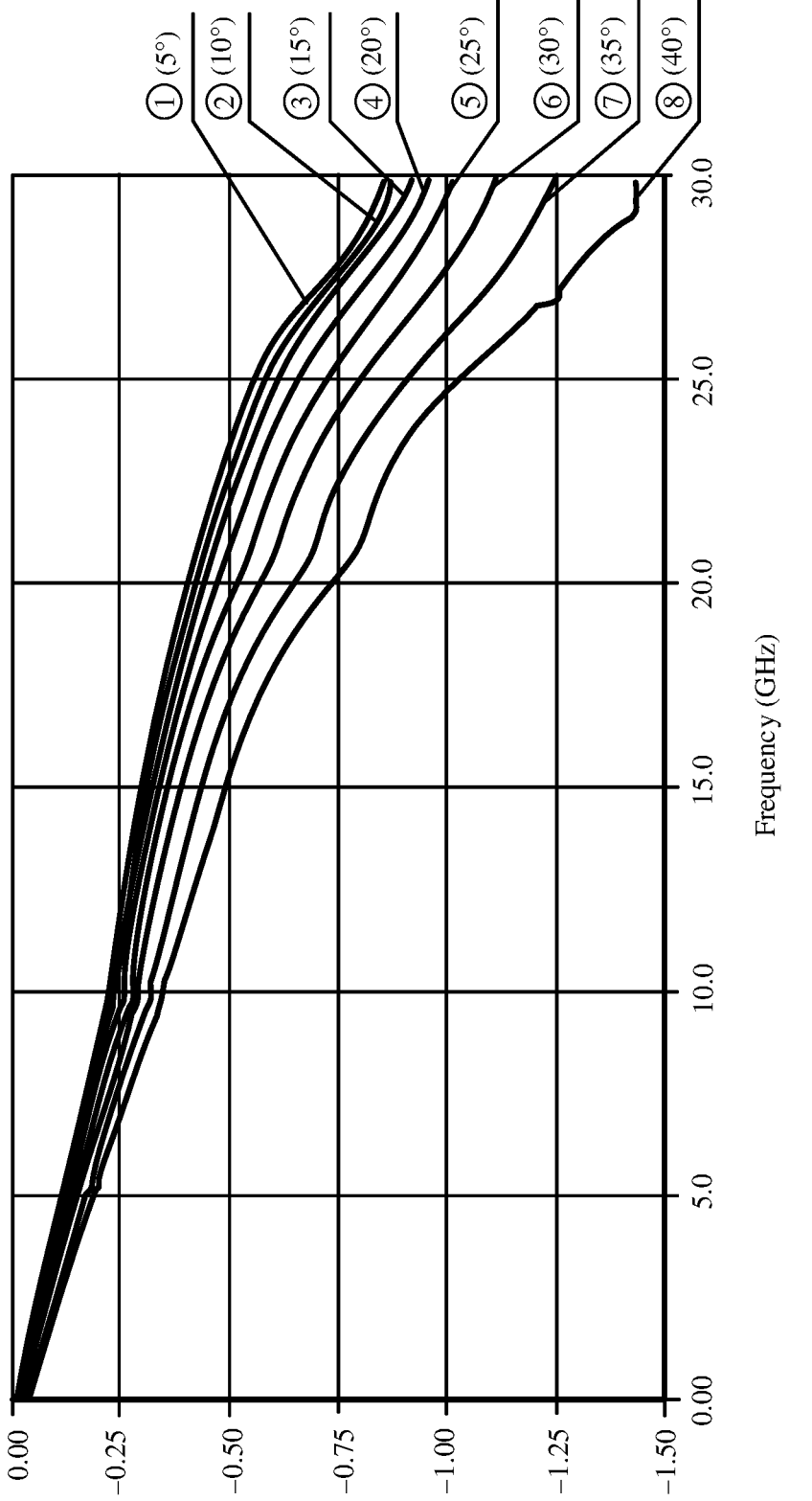
FIG. 3f is an example differential-mode insertion loss curve of a differential pin pair in the pin arrangement in FIG. 3e.

When the first pin 322a and the second pin 322b are symmetrically disposed about the first imaginary straight line O1-O1, the first included angle γ1 and the second included angle γ2 are equal. In this case, eight curves in FIG. 3f are respectively differential-mode insertion loss curves of the first differential pin pair 311 when the first included angle γ1 and the second included angle γ2 are 5°, 10°, 15°, 20°, 25°, 30°, 35°, and 40° sequentially. In FIG. 3f, a horizontal coordinate is a frequency, and a vertical coordinate is a differential-mode insertion loss. As can be learned from FIG. 3f, in the frequency range of 0 GHz to 30 GHz, the resonance phenomenon of the differential-mode insertion loss of the first differential pin pair 311 becomes more obvious when the first included angle γ1 and the second included angle γ2 are larger.

In addition, the resonance phenomenon is related to a frequency. For example, when the frequency is in a range of 0 GHz to 10 GHz and the first included angle γ1 and the second included angle γ2 are in the range of 0° to 45°, changes of all differential-mode insertion loss curves of the first differential pin pair 311 are similar, the resonance phenomenon is not obvious, and performance of the terminal device having the chip packaging apparatus 300 is not greatly affected.

In addition, as can be learned from FIG. 3f, in the range of 0° to 45°, when the first included angle γ1 and the second included angle γ2 are smaller, for example, are 5°, 10° or 15°, a differential-mode insertion loss curve of the first differential pin pair 311 changes slowly, and a probability that a resonance phenomenon is caused is low. Therefore, in some embodiments of this application, the first included angle γ1 and the second included angle γ2 may be 5°, 10°, or 15°.

Figure 3G:
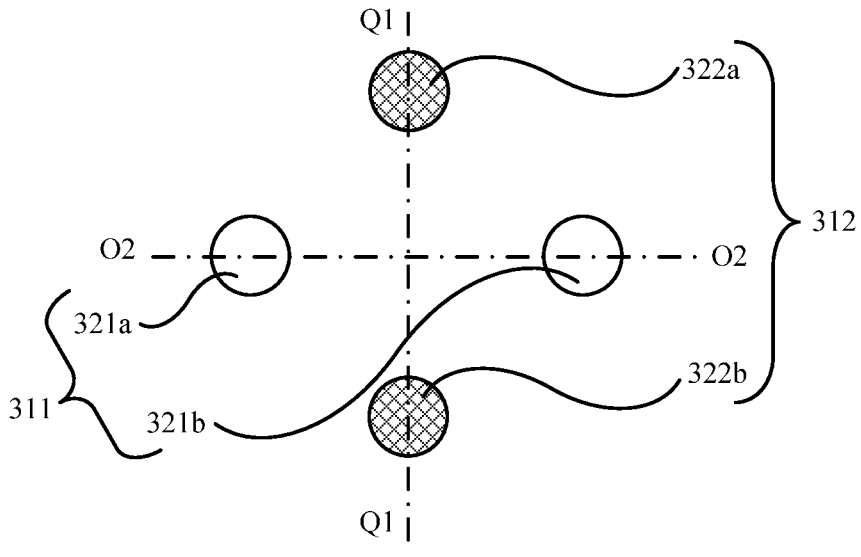
FIG. 3g is an example schematic diagram of another arrangement of a plurality of pins located on a same side of a packaging substrate in FIG. 2c.

Alternatively, in some embodiments of this application, for another example, as shown in FIG. 3g, to further reduce adverse impact of the voltage between the first pin 322a and the second pin 322b on the differential signal transmitted by the first differential pin pair 311, the first pin 322a and the second pin 322b may be located on the zero potential plane Q1-Q1.

In this case, as shown in FIG. 3g, the zero potential plane Q1-Q1 between the first differential signal pin 321a and the second differential signal pin 321b passes through the centers of the first pin 322a and the second pin 322b. In this case, the first pin 322a and the second pin 322b are located on the zero potential plane Q1-Q1. This can minimize a probability that the first differential pin pair 311, the first pin 322a, and the second pin 322b form a resonant circuit. This can minimize adverse impact of the voltage between the first pin 322a and the second pin 322b on the differential signal transmitted by the first differential pin pair 311.

In addition, in some embodiments of this application, both the first pin 322a and the second pin 322b may be power pins. This can increase a quantity of power pins between the chip 30 and the packaging substrate 31, and enhance a power flow capability.

Alternatively, in other embodiments of this application, the first pin 322a and the second pin 322b may constitute another differential pin pair for transmitting a differential signal, such as a second differential pin pair 312 shown in FIG. 3g.

The first differential pin pair 311 formed by the first differential signal pin 321a and the second differential signal pin 321b, and the second differential pin pair 312 formed by the first pin 322a and the second pin 322b can transmit different differential signals. This can increase a quantity of differential signal pins between the chip 30 and the packaging substrate 31, such that the chip packaging apparatus 300 with a limited package size can transmit more differential signals.

Figure 1A:
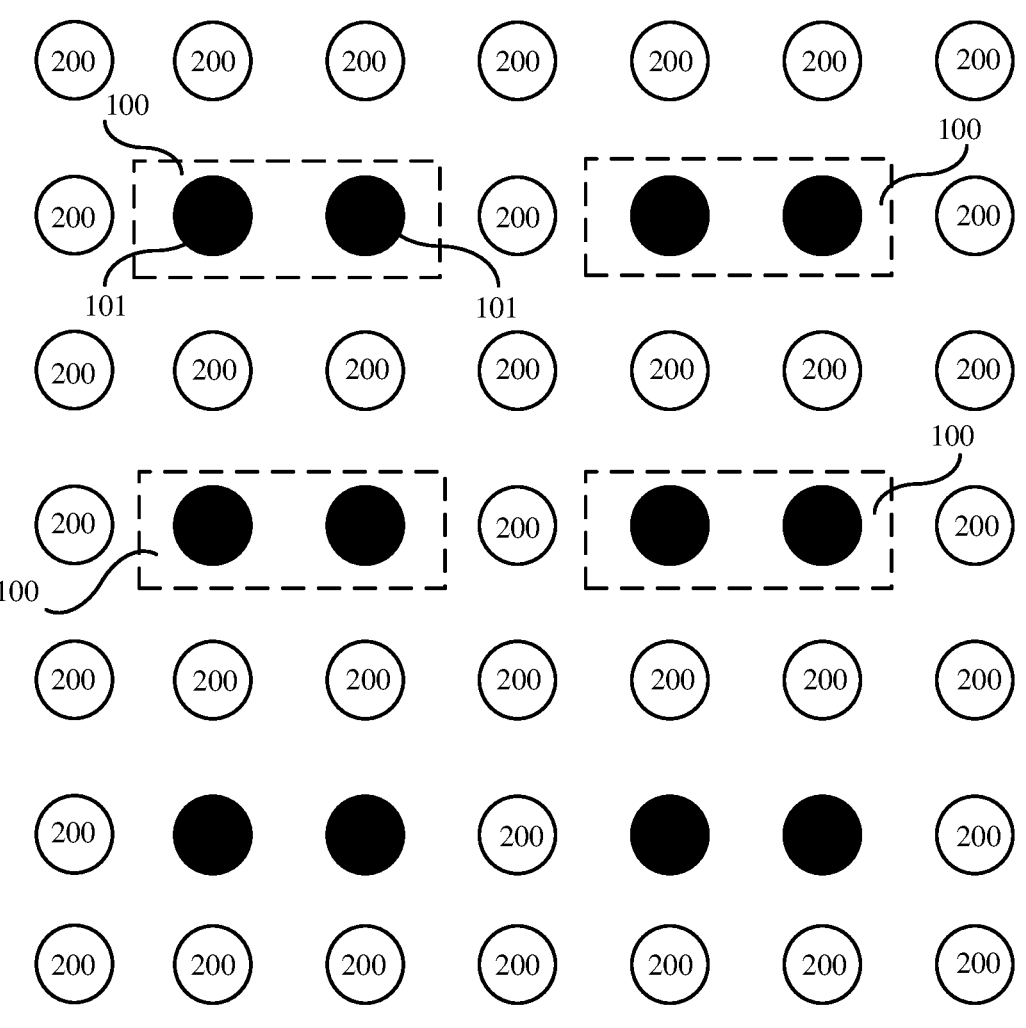
FIG. 1a is an example arrangement of a plurality of pins in the conventional technology.
Figure 1B:
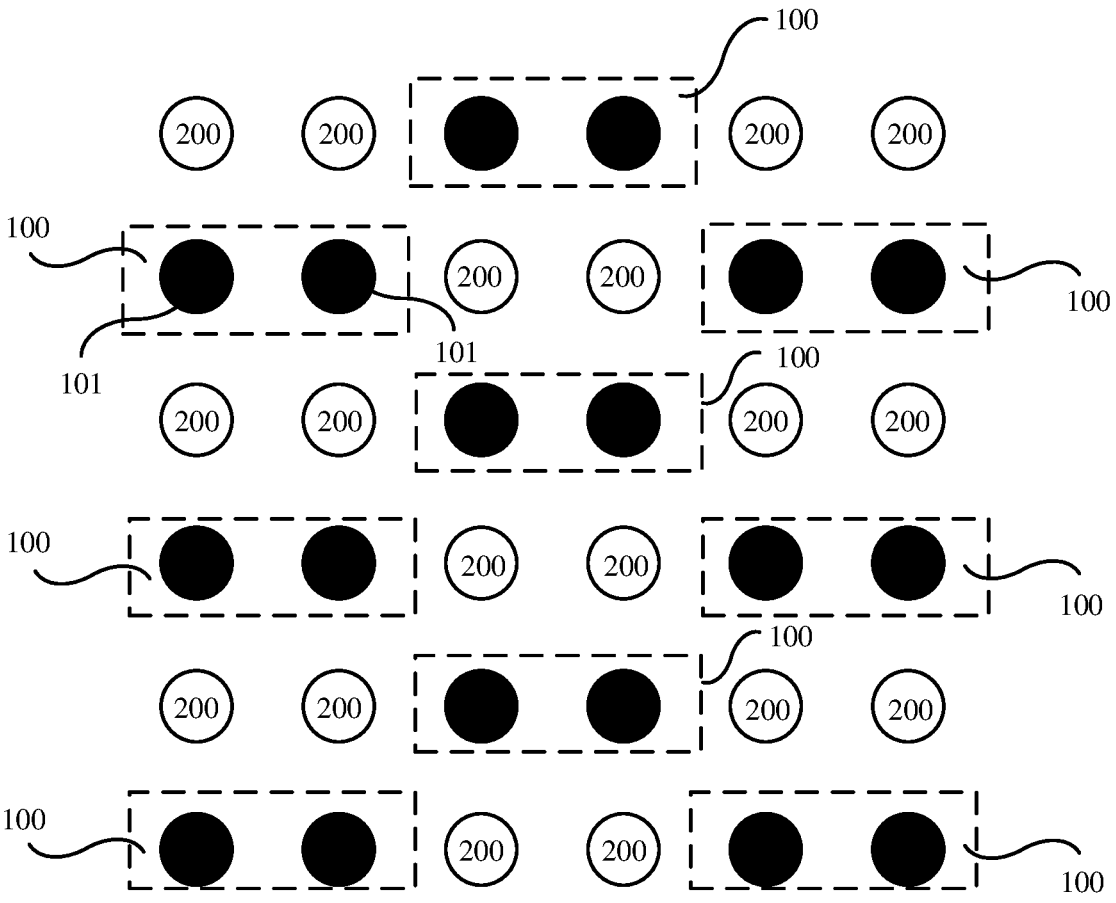
FIG. 1b is an example arrangement of a plurality of pins in the conventional technology.

In a staggered arrangement of positions of two adjacent rows of differential pin pairs 100 shown in FIG. 1b, because ground pins 200 are not disposed between a differential pin pair 100 located in a first row and a differential pin pair 100 located on the left (or right) in a second row, there is signal crosstalk. In comparison, in this embodiment of this application, when the first pin 322a and the second pin 322b constitute the second differential pin pair 312, the first pin 322a and the second pin 322b may be respectively located on two sides of the first differential pin pair 311 in the disposition manner shown in FIG. 3c, FIG. 3e, or FIG. 3g. Therefore, the first differential signal pin 321a and the second differential signal pin 321b in the first differential pin pair 311 can be close to or located on a zero potential plane Q2-Q2 (as shown in FIG. 3g) between the first pin 322a and the second pin 322b. Therefore, the differential signal transmitted by the first differential pin pair 311 and the differential signal transmitted by the second differential pin pair 312 do not interfere with each other.

As can be learned from above, in the chip packaging apparatus 300 provided in this application, pins in positions close to a differential pin pair such as the first differential pin pair 311, for example, the first pin 322*a* and the second pin 322*b*, are no longer ground pins 200 shown in FIG. 1*a*, but are pins that can be used to transmit a differential signal or a supply voltage. Therefore, the quantity of signal pins or power pins in the chip packaging apparatus 300 in limited component space can be increased. This helps reduce the size of the chip packaging apparatus 300.

In addition, in the chip packaging apparatus 300 provided in this application, when the first pin 322*a* and the second pin 322*b* constitute the second differential pin pair 312, the first pin 322*a* and the second pin 322*b* of the second differential pin pair 312 may be located in or close to positions on the zero potential plane Q1-Q1 between the first differential signal pin 321*a* and the second differential signal pin 321*b*. Therefore, in comparison with the staggered arrangement of positions of two adjacent rows of differential pin pairs 100 shown in FIG. 1*b*, the chip packaging apparatus 300 provided in this application can effectively reduce crosstalk of differential signals between the adjacent first differential pin pair 311 and second differential pin pair 312.

The foregoing description is provided using an arrangement of the plurality of first-level pins 32*a* located between the chip 30 and the packaging substrate 31 in FIG. 2*c* as an example. On this basis, to further reduce adverse impact of the voltage between the first pin 322*a* and the second pin 322*b* in the plurality of first-level pins 32*a* on the differential signal transmitted by the first differential pin pair 311, the following describes a manner of disposing a structure of the packaging substrate 31 electrically connected to the first pin 322*a* and the second pin 322*b*, and the first differential signal pin 321*a* and the second differential signal pin 321*b* in the first differential pin pair 311.

Figure 4A:
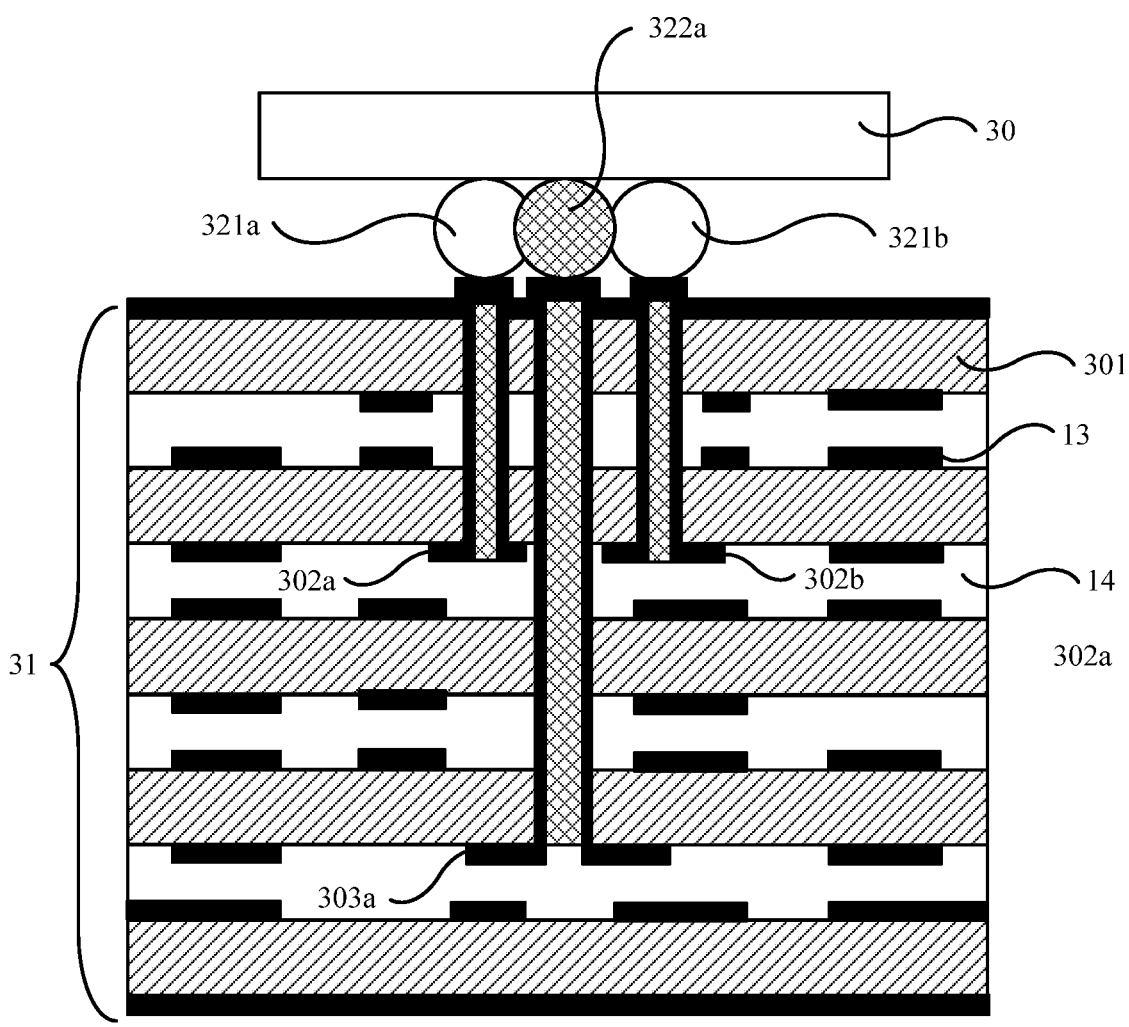
FIG. 4a is an example cross-sectional schematic diagram of an internal structure of a packaging substrate electrically connected to a plurality of pins.

For example, as shown in FIG. 4*a* (a cross-sectional view of the packaging substrate 31), the packaging substrate 31 includes at least one insulation layer 301. Two adjacent insulation layers 301 with lines disposed on their surfaces are bonded together by an adhesive layer 14.

Upper and lower surfaces of the insulation layer 301 are covered with a metal layer, for example, a copper layer. The copper layer can be patterned to form a plurality of lines 13 capable of conducting electricity.

Figure 4B:
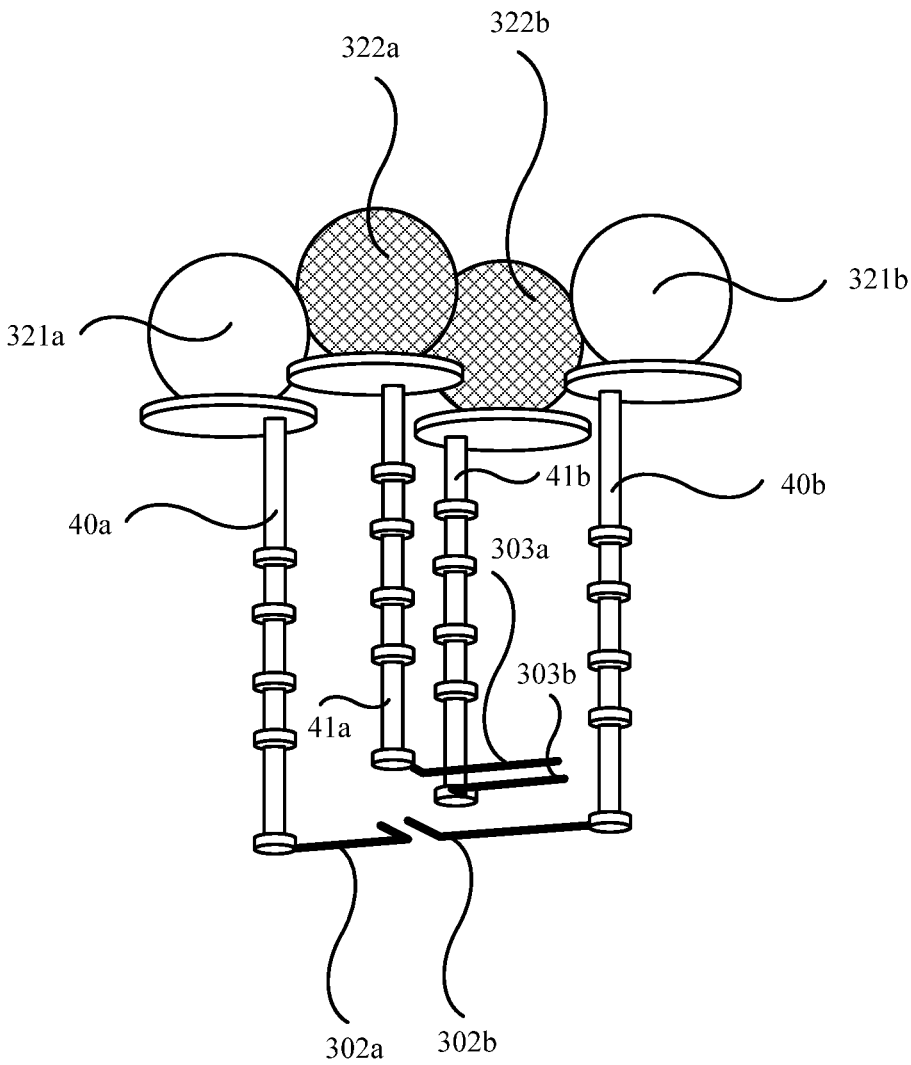
FIG. 4b is an example three-dimensional schematic diagram of an internal structure of a packaging substrate electrically connected to a plurality of pins.

The plurality of lines 13 include a first differential line 302*a* electrically connected to the first differential signal pin 321*a*, a second differential line 302*b* electrically connected to the second differential signal pin 321*b*, a first line 303*a* electrically connected to the first pin 322*a*, and a second line 303*b* electrically connected to the second pin 322*b* as shown in FIG. 4*b* (a three-dimensional diagram of an internal structure of the packaging substrate 31). It should be noted that the second pin 322*b* is not cut in the cross-sectional view shown in FIG. 4*a*.

At least one insulation layer 301 exists between the first line 303*a* electrically connected to the first pin 322*a* and the first differential line 302*a* electrically connected to the first differential signal pin 321*a*, and between the first line 303*a* and the second differential line 302*b* electrically connected to the second differential signal pin 321*b*. Therefore, the first line 303*a* can be isolated from the first differential line 302*a* and the second differential line 302*b* by the insulation layer 301.

Therefore, as shown in FIG. 4*b*, lines of the first pin 322*a*, the first differential signal pin 321*a*, and the second differential signal pin 321*b* are led out from different layers in the packaging substrate 31, and adverse impact of the first pin 322*a* on the differential signal of the first differential pin pair 311 is reduced.

Likewise, at least one insulation layer 301 exists between the second line 303*b* electrically connected to the second pin 322*b* and the first differential line 302*a* electrically connected to the first differential signal pin 321*a* and between the second line 303*b* and the second differential line 302*b* electrically connected to the second differential signal pin 321*b*. Therefore, the second line 303*b* can be isolated from the first differential line 302*a* and the second differential line 302*b* by the insulation layer 301.

Therefore, as shown in FIG. 4*b*, lines of the second pin 322*b*, the first differential signal pin 321*a*, and the second differential signal pin 321*b* are led out from different layers in the packaging substrate 31, and adverse impact of the second pin 322*b* on the differential signal of the first differential pin pair 311 is reduced.

Figure 5A:
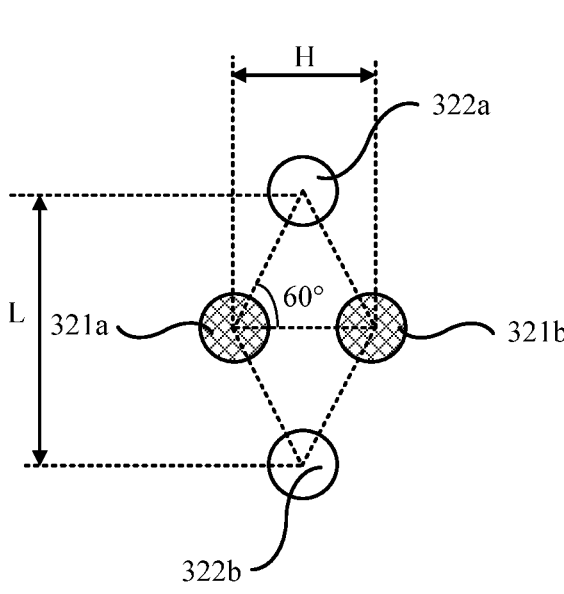
FIG. 5a is an example schematic diagram of another arrangement of a plurality of pins located on a same side of a packaging substrate in FIG. 2b.

The following uses an example in which a pin assembly 20 (as shown in FIG. 5*a*) is constituted by at least the adjacent first differential signal pin 321*a* and second differential signal pin 321*b*, and the first pin 322*a* and the second pin 322*b* located between the first differential signal pin 321*a* and the second differential signal pin 321*b*, to describe a manner of disposing the pin assembly 20 when the plurality of first-level pins 32*a* between the chip 30 and the packaging substrate 31 include at least one pin assembly 20.

Example 1

In this example, as shown in FIG. 5*a* (vertical projection of the plurality of first-level pins 32*a* on the lower surface of the chip 30), in the same pin assembly 20, a spacing H between the first pin 322*a* and the first differential signal pin 321*a*, a spacing between the first pin 322*a* and second differential signal pin 321*b*, a spacing between the second pin 322*b* and the first differential signal pin 321*a*, a spacing between the second pin 322*b* and the second differential signal pin 321*b*, and a spacing between the first differential signal pin 321*a* and the second differential signal pin 321*b* are all equal.

For example, H may be 1 mm.

In this case, connection lines between the center of the first pin 322*a*, the center of the first differential signal pin 321*a*, and the center of the second differential signal pin 321*b* form an isosceles triangle. Connection lines between the center of the second pin 322*b*, the center of the first differential signal pin 321*a*, and the center of the second differential signal pin 321*b* form an isosceles triangle.

Based on this, as shown in FIG. 5*a*, the spacing H between the first differential signal pin 321*a* and the second differential signal pin 321*b* is less than a spacing L between the first pin 322*a* and the second pin 322*b*. Therefore, pin component space of the chip packaging apparatus 300 can be saved by reducing the spacing between the first differential signal pin 321*a* and the second differential signal pin 321*b*.

In this case, the first differential signal pin 321*a* and the second differential signal pin 321*b* in the first differential pin pair 311 are tightly coupled. When the first pin 322*a* and the second pin 322*b* constitute the second differential pin pair 312 for transmitting the differential signal, the first pin 322*a* and the second pin 322*b* are loosely coupled.

Based on this, the packaging substrate 31 electrically connected to the pin assembly 20 includes a first differential via 40*a*, a second differential via 40*b*, a first via 41*a*, and a second via 41*b* shown in FIG. 4*b*.

The first differential via 40*a* is electrically connected to the first differential signal pin 321*a*. The second differential via 40*b* is electrically connected to the second differential signal pin 321b. The first via 41a is electrically connected to the first pin 322a. The second via 41b is electrically connected to the second pin 322b.

Figure 5B:
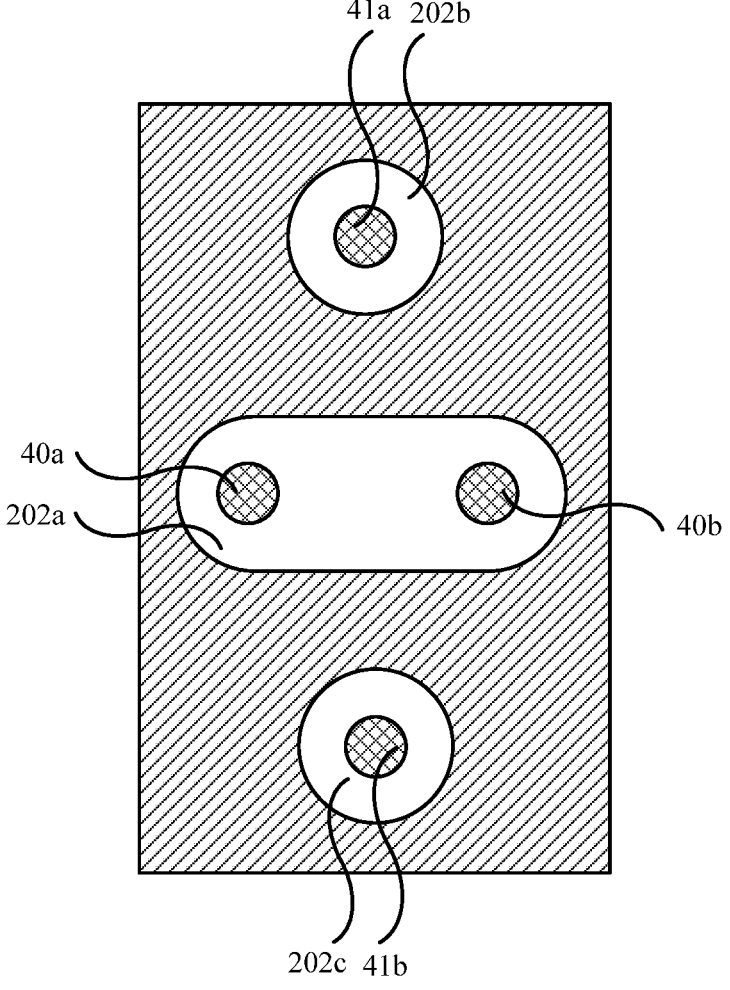

In addition, the packaging substrate 31 further includes a ground plane shown in FIG. 5b (a top view of the ground plane inside the packaging substrate 31). An anti-pad 202a of the first differential via 40a and an anti-pad 202a of the second differential via 40b on the same ground plane in the packaging substrate 31 are interconnected.

In this case, the anti-pads 202a of the tightly coupled first differential signal pin 321a and second differential signal pin 321b on the same ground plane are interconnected. The interconnected anti-pads 202a are located between the first pin 322a and the second pin 322b.

In this way, an anti-pad 202b of the first via 41a on the ground plane and an anti-pad 202c of the second via 41a on the ground plane can be separated by the interconnected anti-pads 202a. Further, an objective of isolating the first differential pin pair 311 (including the first differential signal pin 321a and the second differential signal pin 321b) from the first pin 322a and the second pin 322b is achieved.

Figure 5C:
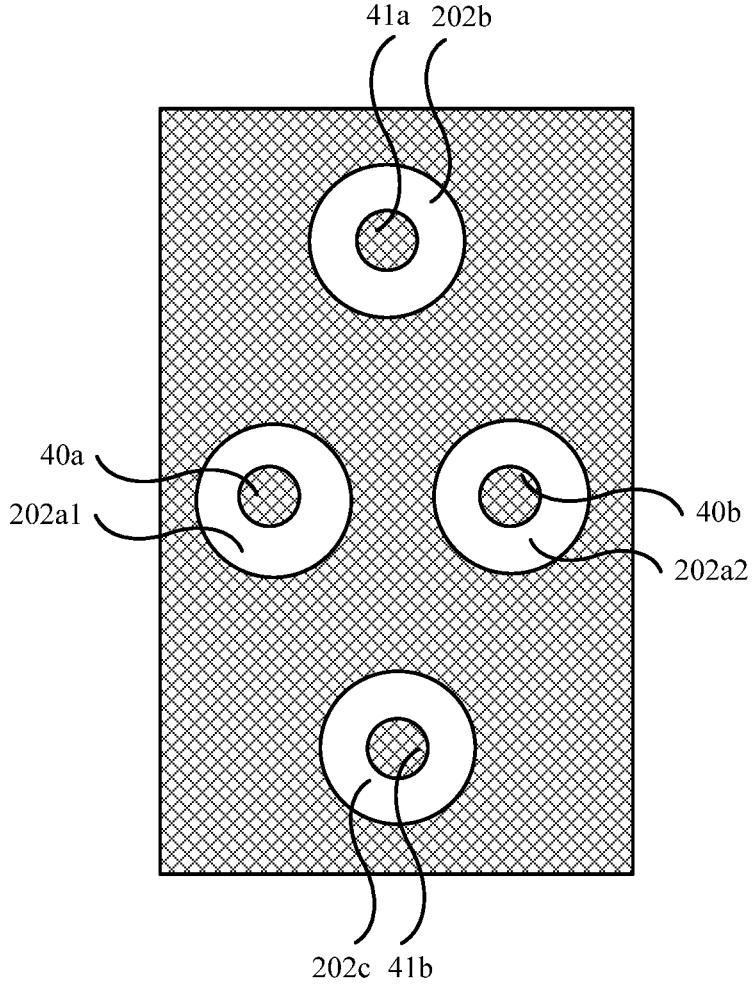

Alternatively, in other embodiments of this application, an anti-pad 202a1 (as shown in FIG. 5c) of the first differential via 40a on the ground plane in the packaging substrate 31 is isolated from an anti-pad 202a2 of the second differential via 40b on the same ground plane in the packaging substrate 31.

The following describes the arrangement of the plurality of first-level pins 32a when the chip packaging apparatus 300 includes a plurality of pins arranged in an array, such as the first-level pins 32a, and the plurality of first-level pins 32a arranged in the array include the pin assembly 20.

Figure 5D:
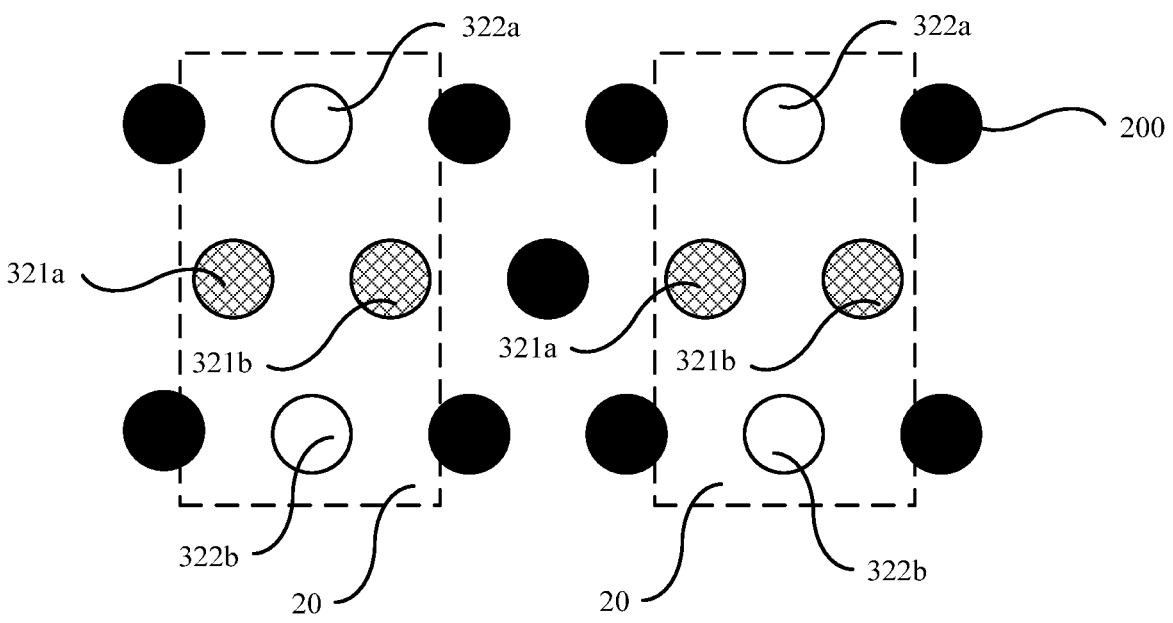
FIG. 5d is an example schematic diagram of another arrangement of a plurality of pins located on a same side of a packaging substrate in FIG. 2b.

As shown in FIG. 5d (vertical projection of the plurality of first-level pins 32a on the lower surface of the chip 30), in the same pin assembly 20, the first pin 322a is located in an $N^{th}$ row and an $M^{th}$ column. N≥1, M≥2, and N and M are positive integers. For example, the first pin 322a is located in a first row and a second column.

The first differential signal pin 321a is located in an $(N+1)^{th}$ row and an $(M-1)^{th}$ column, and the second differential signal pin 321b is located in the $(N+1)^{th}$ row and an $(M+1)^{th}$ column. For example, the first differential signal pin 321a is located in a second row and a first column, and the second differential signal pin 321b is located in the second row and a third column. The second pin 322b is located in an $(N+2)^{th}$ row and the $M^{th}$ column. For example, the second pin 322b is located in a third row and the second column.

It should be noted that, for ease of description, in FIG. 5d, a left column of ground pins (black circles) is not set as the first column, but a column in which the first differential signal pin 321a in the leftmost pin assembly 20 is located is set as the first column. Because the first pins and the second pins are staggered, the first column of the leftmost pin assembly 20 includes only the first differential signal pin 321a.

In addition, in the same pin assembly 20 in this embodiment of this application, a direction of a connection line between the centers of the first differential signal pin 321a and the second differential signal pin 321b forming a differential pin pair, such as the first differential pin pair 311, is a row direction, and a direction perpendicular to the direction of the connection line between the centers of the first differential signal pin 321a and the second differential signal pin 321b is a column direction.

In addition, the chip packaging apparatus 300 further includes a plurality of ground pins 200 shown in FIG. 5d. The plurality of ground pins 200 may be disposed between two adjacent pin assemblies 20.

For example, in the first row, there are two ground pins 200 between the first pin 322a in one pin assembly 20 and the first pin 322a in the other pin assembly 20. The ground pins 200 are configured to isolate the two first pins 322a located in the same row in different pin assemblies 20.

In the second row, there is one ground pin 200 between the second differential signal pin 321b in one pin assembly 20 and the first differential signal pin 321a in the other pin assembly 20. The ground pin 200 is configured to isolate the two differential signal pins located in the same row in different pin assemblies 20.

In the third row, there are two ground pins 200 between the second pin 322b in one pin assembly 20 and the second pin 322b in the other pin assembly 20. The ground pins 200 are configured to isolate the two second pins 322b located in the same row in different pin assemblies 20.

Figure 6:
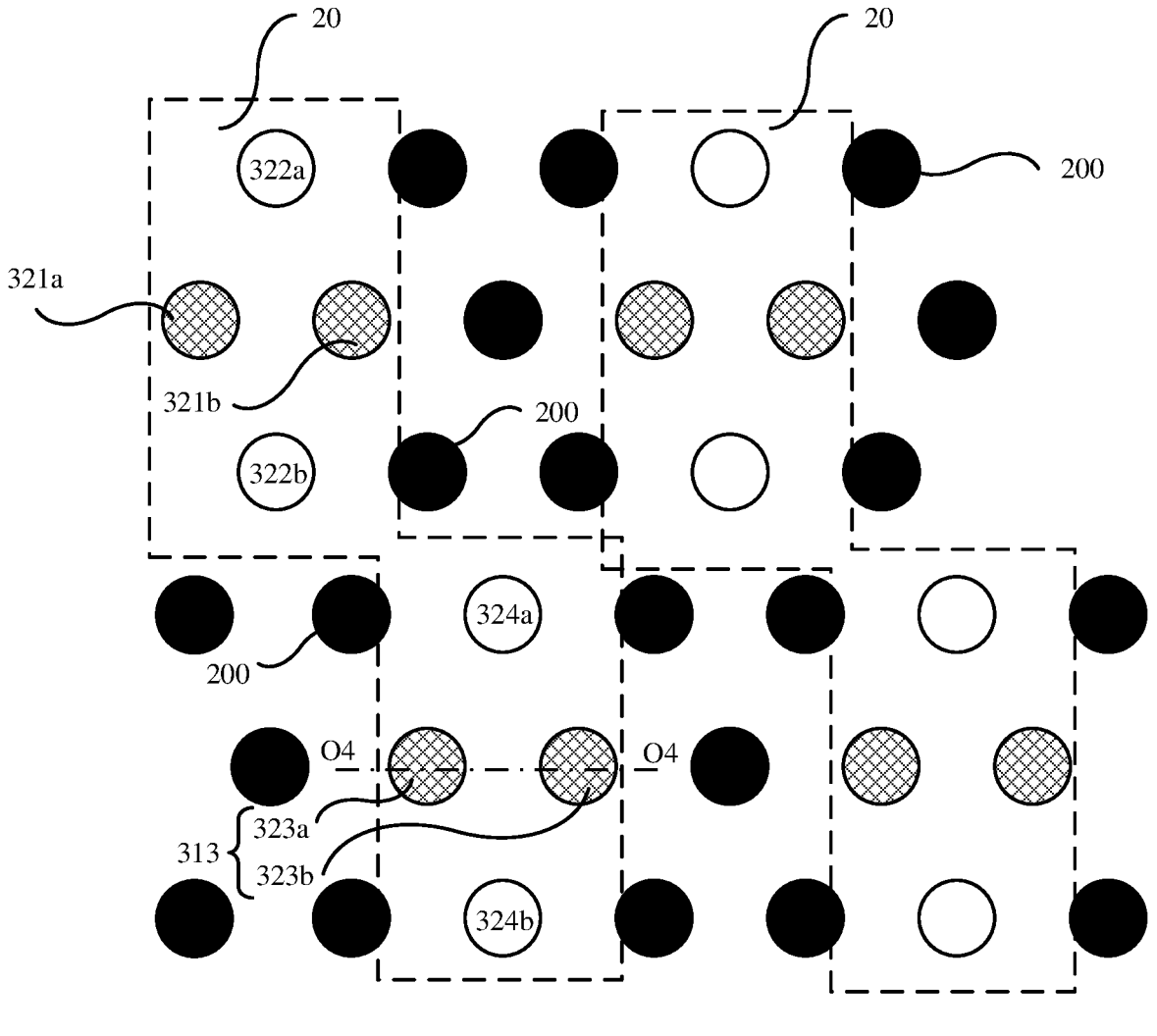
FIG. 6 is an example schematic diagram of another arrangement of a plurality of pins located on a same side of a packaging substrate in FIG. 2b.

In addition, in other embodiments of this application, the pin assembly 20 further includes a third differential pin pair 313, a third pin 324a, and a fourth pin 324b that are disposed on a surface of one side of the chip 30 facing the packaging substrate 31, as shown in FIG. 6 (vertical projection of the plurality of first-level pins 32a on the lower surface of the chip 30). The third differential pin pair 313 includes a third differential signal pin 323a and a fourth differential signal pin 323b. The third pin 324a and the fourth pin 324b are located between the third differential signal pin 323a and the fourth differential signal pin 323b. The third pin 324a and the fourth pin 324b are respectively located on two sides of the third differential pin pair 313, that is, the third pin 324a and the fourth pin 324b are respectively located on two sides of a fourth imaginary straight line O4-O4 connecting the third differential signal pin 323a to the fourth differential signal pin 323b.

In addition, the third pin 324a is adjacent to the third differential signal pin 323a and the fourth differential signal pin 323b. The fourth pin 324b is adjacent to the third differential signal pin 323a and the fourth differential signal pin 323b.

Likewise, in the same pin assembly 20, connection lines between a center of the third pin 324a, a center of the third differential signal pin 323a, and a center of the fourth differential signal pin 323b form an isosceles triangle. Connection lines between a center of the fourth pin 324b, the center of the third differential signal pin 323a, and the center of the fourth differential signal pin 323b form an isosceles triangle.

In addition, the third pin 324a is a signal pin or a power pin. The fourth pin 324b is a signal pin or a power pin. A manner of disposing the third pin 324a and the fourth pin 324b is similar to the manner of disposing the first pin 322a and the second pin 322b.

In this case, the third pin 324a is located in an $(N+3)^{th}$ row and an $(M+3)^{th}$ column, for example, located in a fourth row and a fifth column. The third differential signal pin 323a is located in an $(N+4)^{th}$ row and an $(M+2)^{th}$ column, and the fourth differential signal pin 323b is located in the $(N+4)^{th}$ row and an $(M+4)^{th}$ column. For example, the third differential signal pin 323a is located in a fifth row and a fourth column, and the fourth differential signal pin 323b is located in the fifth row and a sixth column. The fourth pin 324b is located in an $(N+5)^{th}$ row and the $(M+3)^{th}$ column. For example, the fourth pin 324b is located in a sixth row and the fifth column.

In addition, the chip packaging apparatus 300 further includes a ground pin 200 located in the $(N+2)^{th}$ row and the $(M+2)^{th}$ column (for example, in the third row and the fourth column), and a ground pin 200 located in the (N+3)$^{th}$ row and the (M+1)$^{th}$ column (for example, in the fourth row and the third column).

The ground pin 200 located in the (N+2)$^{th}$ row and the (M+2)$^{th}$ column (for example, the third row and the fourth column) can isolate the second differential signal pin 321b from the third pin 324a in the same pin assembly 20, thereby reducing signal crosstalk.

The ground pin 200 located in the (N+3)$^{th}$ row and the (M+1)$^{th}$ column (for example, the fourth row and the third column) can isolate the second pin 322b from the third differential signal pin 323a in the same pin assembly 20, thereby reducing signal crosstalk.

Example 2

In this example, as in the example 1, connection lines between the center of the first pin 322a, the center of the first differential signal pin 321a, and the center of the second differential signal pin 321b in the same pin assembly form an isosceles triangle. Connection lines between the center of the second pin 322b, the center of the first differential signal pin 321a, and the center of the second differential signal pin 321b form an isosceles triangle.

Figure 7:
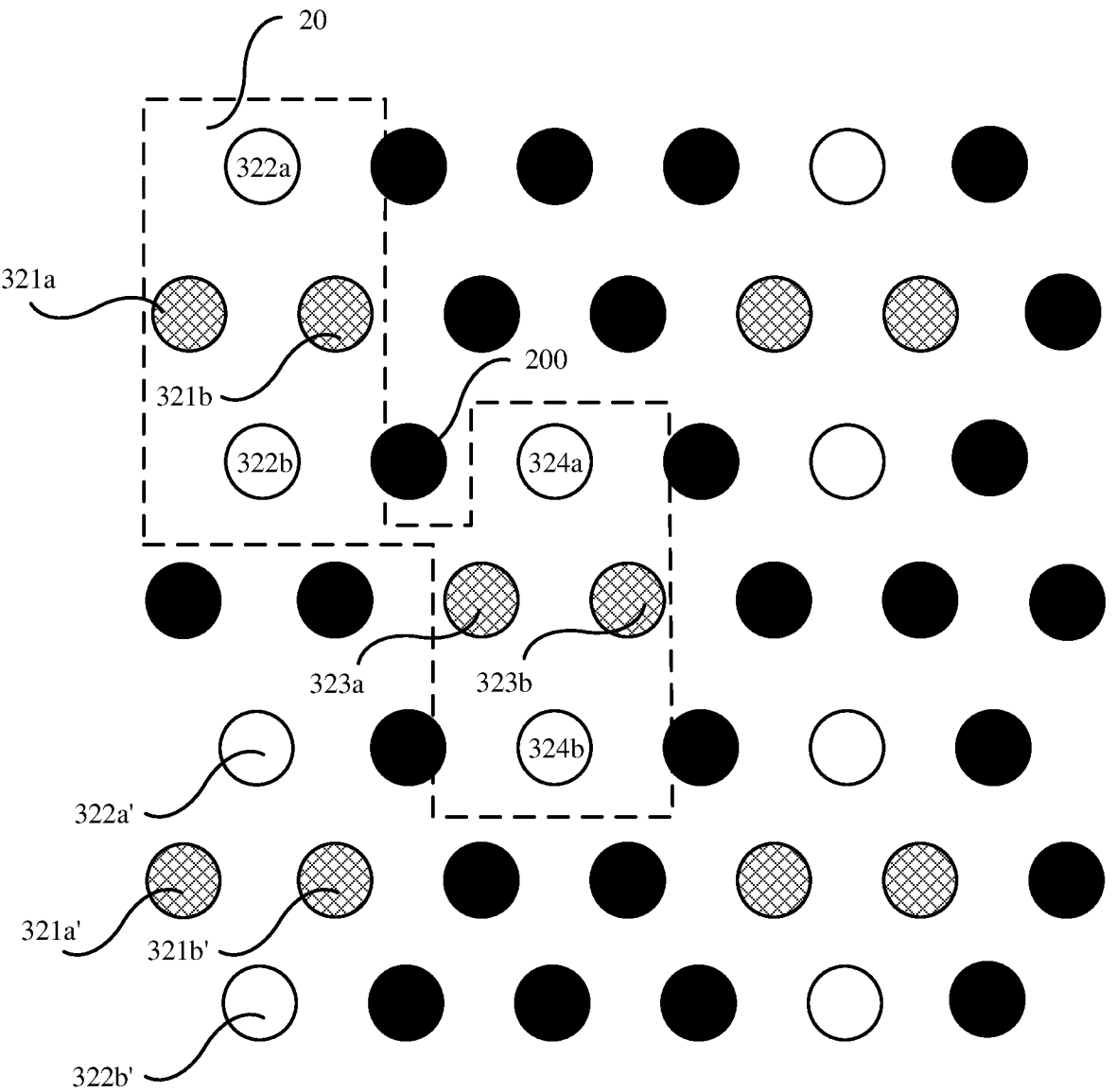
FIG. 7 is an example schematic diagram of another arrangement of a plurality of pins located on a same side of a packaging substrate in FIG. 2b.

In this case, as shown in FIG. 7 (vertical projection of the plurality of first-level pins 32a on the lower surface of the chip 30), in the same pin assembly 20, the first pin 322a is located in an N$^{th}$ row and an M$^{th}$ column. N≥1, M≥2, and N and M are positive integers. For example, the first pin 322a is located in a first row and a second column. The first differential signal pin 321a is located in an (N+1)$^{th}$ row and an (M−1)$^{th}$ column, and the second differential signal pin 321b is located in the (N+1)$^{th}$ row and an (M+1)$^{th}$ column. For example, the first differential signal pin 321a is located in a second row and a first column, and the second differential signal pin 321b is located in the second row and a third column. The second pin 322b is located in an (N+2)$^{th}$ row and the M$^{th}$ column. For example, the second pin 322b is located in a third row and the second column.

In addition, as shown in FIG. 7, when the pin assembly 20 further includes a third pin 324a, a fourth pin 324b, a third differential signal pin 323a, and a fourth differential signal pin 323b, connection lines between a center of the third pin 324a, a center of the third differential signal pin 323a, and a center of the fourth differential signal pin 323b form an isosceles triangle. Connection lines between a center of the fourth pin 324b, the center of the third differential signal pin 323a, and the center of the fourth differential signal pin 323b form an isosceles triangle.

A difference from the example 1 lies in that, in the same pin assembly 20, the third pin 324a is located in the (N+2)$^{th}$ row and an (M+4)$^{th}$ column. For example, the third pin 323a is located in the third row and a sixth column.

The third differential signal pin 323a is located in an (N+3)$^{th}$ row and an (M+3)$^{th}$ column. The fourth differential signal pin 323b is located in the (N+3)$^{th}$ row and an (M+5)$^{th}$ column. For example, the third differential signal pin 323a is located in a fourth row and a fifth column, and the fourth differential signal pin 323b is located in the fourth row and a seventh column. The fourth pin 324b is located in an (N+4)$^{th}$ row and the (M+4)$^{th}$ column. For example, the fourth pin 324b is located in a fifth row and the sixth column.

In this case, because the third differential signal pin 323a and the second pin 322b in the same pin assembly 20 are located in the same row, a space between the third differential signal pin 323a and the second pin 322b in the same pin assembly 20 can be reduced, to save pin component space in the chip packaging apparatus 300.

In addition, as shown in FIG. 7, the chip packaging apparatus 300 further includes a ground pin 200 located in the (N+2)$^{th}$ row and an (M+2)$^{th}$ column (for example, in the third row and a fourth column), and a ground pin 200 located in an (N+3)$^{th}$ row and an (M+1)$^{th}$ column (for example, in the fourth row and the second column).

In this way, the ground pin 200 located in the (N+2)$^{th}$ row and the (M+2)$^{th}$ column (for example, in the third row and the fourth column) can isolate the second differential signal pin 321b from the third differential signal pin 323a, and the second pin 322b from the third pin 324a in the same pin assembly 20, thereby reducing signal crosstalk.

The following uses the first pin 322a and the second pin 322b in any pin assembly 20 as a differential pin pair. When the third pin 324a and the fourth pin 324b are a differential pin pair, signal crosstalk between adjacent differential pin pairs is shown in Table 1.

TABLE 1

| Difference in signal transmission duration of two pins in a group of differential pin pairs (N/P Skew) (unit: picosecond (ps)) | | 0 | 0.8 | 1.5 |
|---|---|---|---|---|
| Maximum far-end crosstalk (FEXT) (dB) in a frequency range of 0 GHz to 28 GHz | (324a, 324b) and (323a, 323b) | −109.5 | −89.3 | −83.2 |
| | (324a, 324b) and (322a', 322b') | −73.1 | −72.9 | −72.7 |
| | (324a, 324b) and (321a', 321b') | −68.4 | −68.2 | −67.9 |
| | (323a, 323b) and (322a', 322b') | −68.2 | −68.3 | −68.3 |
| | (323a, 323b) and (321a', 321b') | −81.8 | −81.5 | −81.0 |
| | (322a', 322b') and (322a, 322b) | −70.3 | −70.3 | −70.2 |

It can be learned from Table 1 that, when the difference in signal transmission duration of two pins in the group of differential pin pairs is 0 ps, 0.8 ps, or 1.5 ps, far-end crosstalk between differential signals transmitted on two adjacent differential pin pairs can be controlled to be below −65 dB. Therefore, crosstalk between signals can be reduced when signal pins are densely arranged.

In addition, a differential metric for transmitting a high-speed differential signal by any differential pin pair in the pin arrangement shown in FIG. 7 is compared with a differential metric for transmitting a high-speed differential signal by any differential pin pair in the pin arrangement shown in FIG. 1a.

Figure 8A:
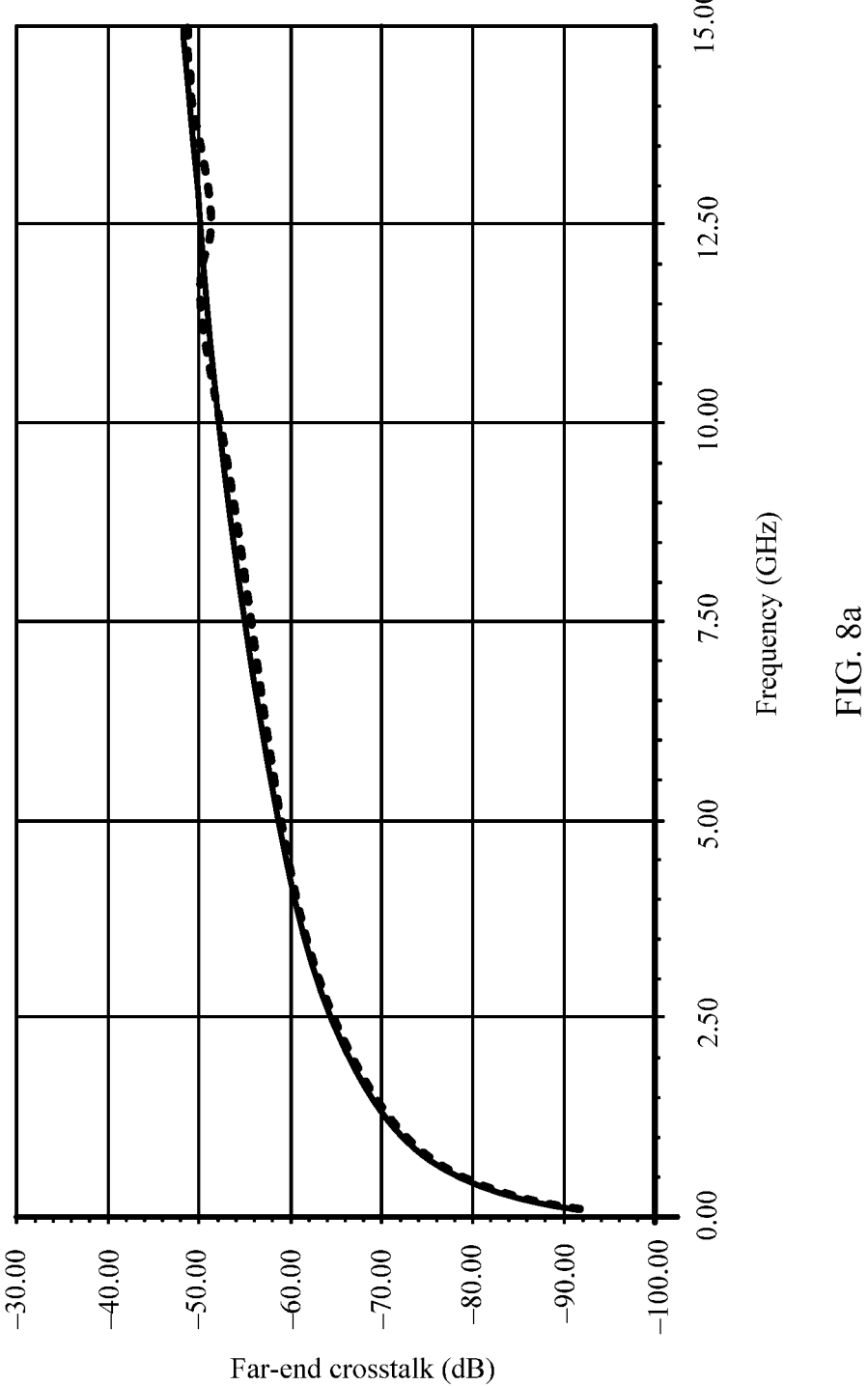
FIG. 8*a* is an example differential-mode far-end crosstalk curve of any group of differential pin pairs in the pin arrangement shown in FIG. 7 and a differential-mode far-end crosstalk curve of any group of differential pin pairs in the pin arrangement shown in FIG. 1*a;*

As shown in FIG. 8a, a horizontal coordinate is a frequency, and a vertical coordinate is far-end crosstalk. It can be learned that a differential-mode far-end crosstalk curve (shown by a dashed line) of any group of differential pin pairs in the pin arrangement shown in FIG. 7 basically overlaps a differential-mode far-end crosstalk curve (shown by a solid line) of any group of differential pin pairs in the pin arrangement shown in FIG. 1a. In addition, far-end crosstalk of the differential pin pair increases gradually in the frequency range of 0 GHz to 15 GHz.

Figure 8B:
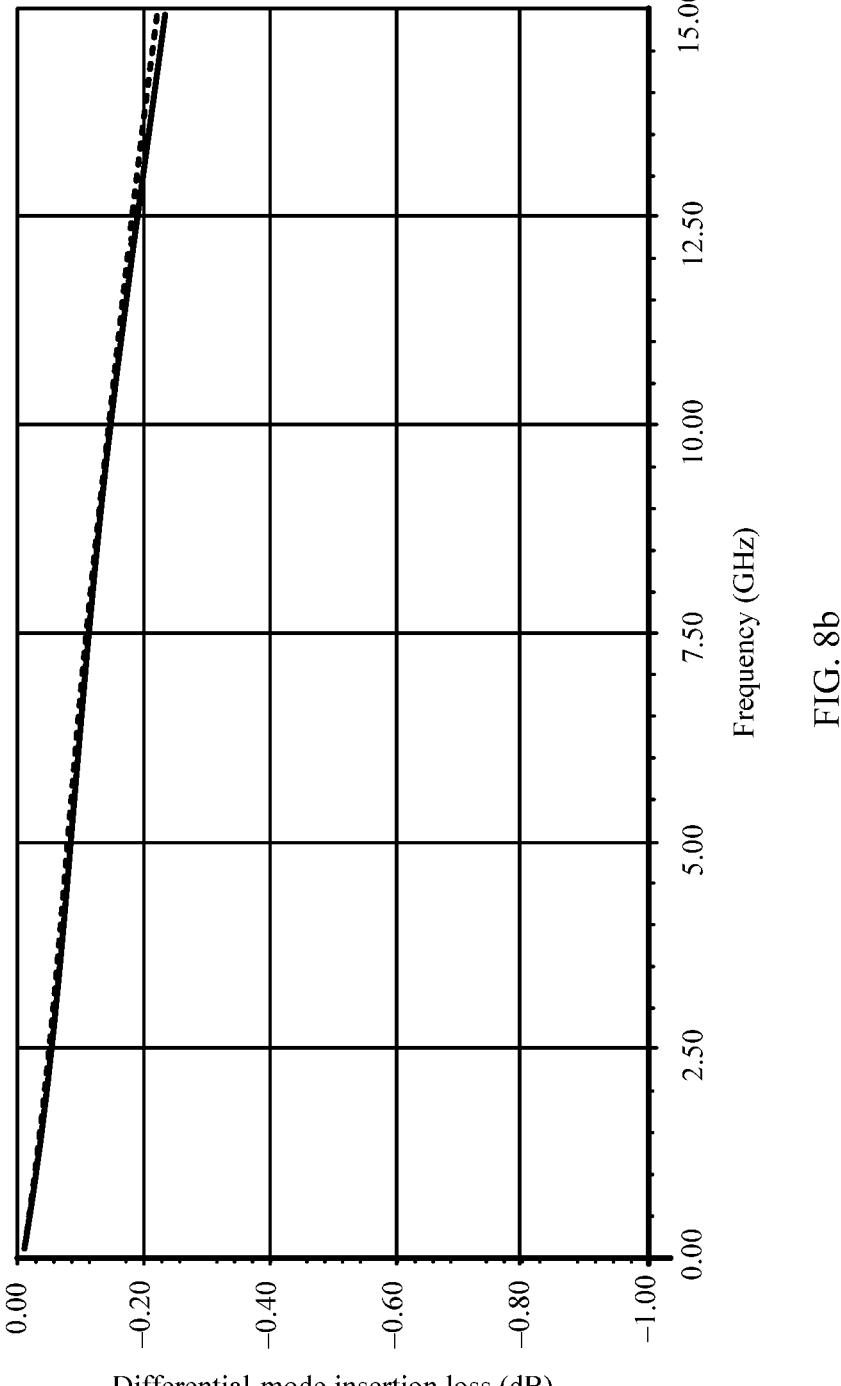
FIG. 8*b* is an example differential-mode insertion loss curve of any group of differential pin pairs in the pin arrangement shown in FIG. 7 and a differential-mode insertion loss curve of any group of differential pin pairs in the pin arrangement shown in FIG. 1*a;*

As shown in FIG. 8b, a horizontal coordinate is a frequency, and a vertical coordinate is a differential-mode insertion loss. It can be learned that a differential mode insertion loss curve (shown by a dashed line) of any group of differential pin pairs in the pin arrangement shown in FIG. 7 basically overlaps a differential-mode insertion loss curve (shown by a solid line) of any group of differential pin pairs in the pin arrangement shown in FIG. 1a. In addition, the differential-mode insertion loss of the differential pin pair decreases gradually in the frequency range of 0 GHz to 15 GHz.

Figure 8C:
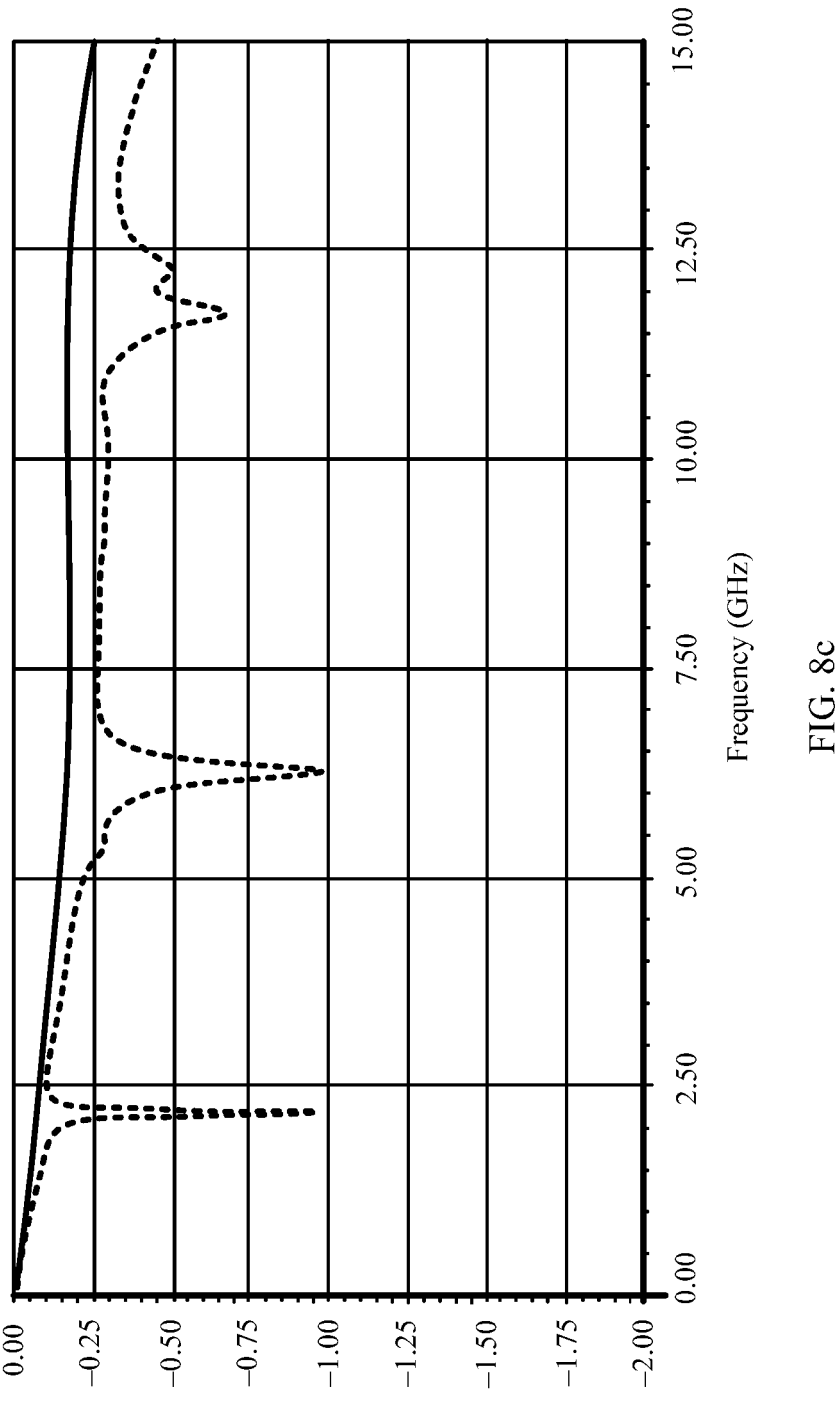
FIG. 8*c* is an example common-mode insertion loss curve of any group of differential pin pairs in the pin arrangement shown in FIG. 7 and a common-mode insertion loss curve of any group of differential pin pairs in the pin arrangement shown in FIG. 1*a;*

As shown in FIG. 8c, a horizontal coordinate is a frequency, and a vertical coordinate is a common-mode insertion loss. A common-mode insertion loss curve (shown by a dashed line) of any group of differential pin pairs in the pin arrangement shown in FIG. 7 is similar to a common-mode insertion loss curve (shown by a solid line) of any group of differential pin pairs in the pin arrangement shown in FIG. 1a. Therefore, the pin arrangement shown in FIG. 7 can effectively suppress common-mode noise of the differential signal. In addition, there is a common-mode filtering effect. For example, in the frequency range of 0 GHz to 15 GHz, a common-mode filter frequency band may be divided into three frequency bands. A center frequency of a first common-mode filter is about 2.21 GHz, and a common-mode insertion loss of a corresponding frequency on the dashed curve is about –0.96 dB. A center frequency of a second common-mode filter is about 6.28 GHz, and a common-mode insertion loss of a corresponding frequency on the dashed curve is about –0.98 dB. A center frequency of a third common-mode filter is about 11.78 GHz, and a common-mode insertion loss of a corresponding frequency on the dashed curve is about –0.67 dB.

Therefore, in comparison with a solution in which the ground pin 200 fully isolates the differential pin pair 100, this embodiment of this application provides a group of differential pin pairs, for example, a solution to staggered disposition of the first differential pin pair 311, the first pin 322a, and the second pin 322b, to increase the quantity of signal pins or power pins in limited component space by adding the first pin 322a and the second pin 322b for transmitting the differential signal or the supply voltage, while ensuring that a differential signal transmission characteristic is the same as that in the pin arrangement shown in FIG. 1a.

It should be noted that the differential metric for transmitting a high-speed differential signal by any group of differential pin pair in the pin arrangement shown in FIG. 7 is described above. In the solution to staggered disposition of the first differential pin pair 311, the first pin 322a, and the second pin 322b according to another example of this application, a differential metric for transmitting a high-speed differential signal by any group of differential pin pairs may be obtained in the same way.

Example 3

In this example, as in the example 1, connection lines between the center of the first pin 322a, the center of the first differential signal pin 321a, and the center of the second differential signal pin 321b in the same pin assembly form an isosceles triangle. Connection lines between the center of the second pin 322b, the center of the first differential signal pin 321a, and the center of the second differential signal pin 321b form an isosceles triangle.

Figure 9:
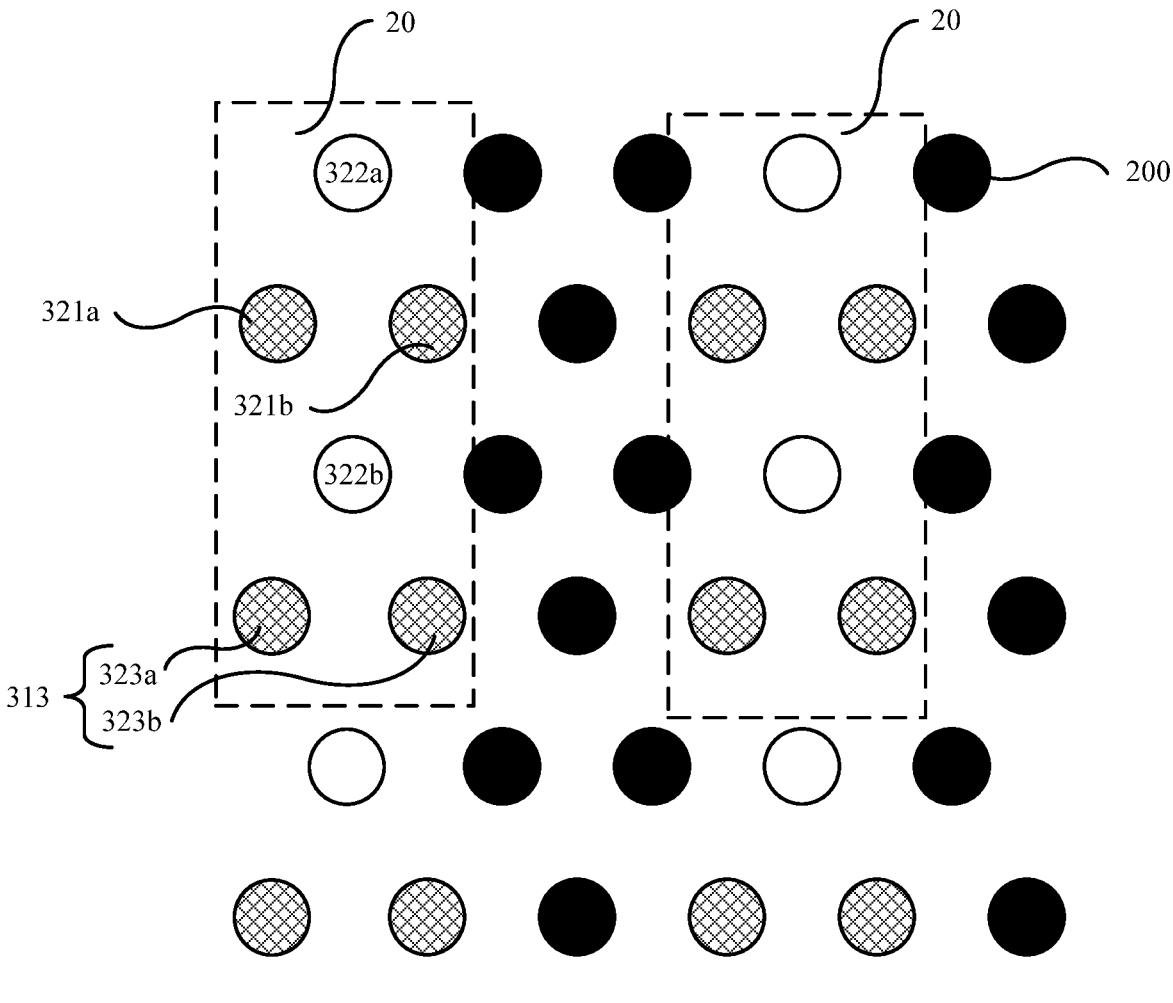
FIG. 9 is an example schematic diagram of another arrangement of a plurality of pins located on a same side of a packaging substrate in FIG. 2*b;*

In this case, as shown in FIG. 9 (vertical projection of the plurality of first-level pins 32a on the lower surface of the chip 30), in the same pin assembly 20, the first pin 322a is located in an $N^{th}$ row and an $M^{th}$ column. N≥1, M≥2, and N and M are positive integers. For example, the first pin 322a is located in a first row and a second column. The first differential signal pin 321a is located in an $(N+1)^{th}$ row and an $(M-1)^{th}$ column, and the second differential signal pin 321b is located in the $(N+1)^{th}$ row and an $(M+1)^{th}$ column. For example, the first differential signal pin 321a is located in a second row and a first column, and the second differential signal pin 321b is located in the second row and a third column. The second pin 322b is located in an $(N+2)^{th}$ row and the $M^{th}$ column. For example, the second pin 322b is located in a third row and the second column.

A difference from the example 1 lies in that, in the same pin assembly 20, the first pin 322a and the second pin 322b may be power pins.

In addition, the pin assembly 20 further includes a third differential pin pair 313 disposed on a surface of one side of the chip 30 facing the packaging substrate 31, as shown in FIG. 9.

The third differential pin pair 313 includes a third differential signal pin 323a and a fourth differential signal pin 323b. The third differential signal pin 323a is located in an $(N+3)^{th}$ row and the $(M-1)^{th}$ column, and the fourth differential signal pin 323b is located in the $(N+3)^{th}$ row and the $(M+1)^{th}$ column. For example, the third differential signal pin 323a is located in a fourth row and the first column, and the fourth differential signal pin 323b is located in the fourth row and the third column.

In this case, when the first pin 322a and the second pin 322b are located on the zero potential plane Q1-Q1 (shown in FIG. 3d) formed by the differential signal of the first differential pin pair 311, the first pin 322a and the second pin 322b are also located on a zero potential plane (which overlaps the zero potential plane Q1-Q1) formed by a differential signal on the third differential pin pair 313.

Therefore, adverse impact of the second pin 322b close to the third differential pin pair 313 on the differential signal of the third differential pin pair 313 formed by the third differential signal pin 323a and the fourth differential signal pin 323b can be reduced. In addition, the first differential pin pair 311 and the third differential pin pair 313 are separated only by the second pin 322b. Therefore, a quantity of differential pin pairs disposed in the chip packaging apparatus 300 can be increased.

Example 4

Figure 10:
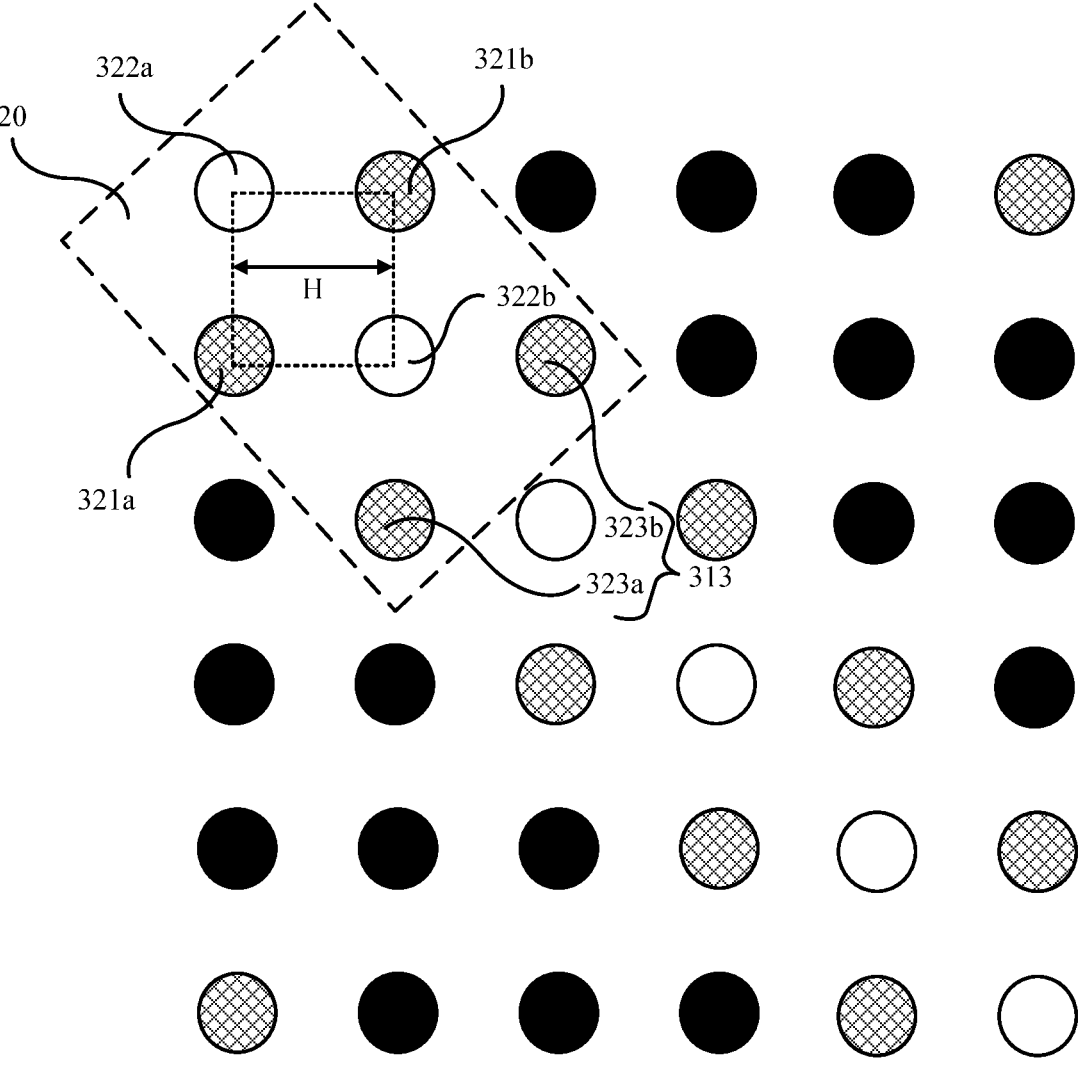
FIG. 10 is an example schematic diagram of another arrangement of a plurality of pins located on a same side of a packaging substrate in FIG. 2*b.

In this example, as shown in FIG. 10 (vertical projection of the plurality of first-level pins 32a on the lower surface of the chip 30), a spacing H between the first pin 322a and the first differential signal pin 321a, a spacing between the first differential signal pin 321a and the second pin 322b, a spacing between the second pin 322b and the second differential signal pin 321b, and a spacing between the second differential signal pin 321b and the first pin 322a are equal. For example, H may be 1 mm.

Therefore, connection lines between the centers of the first pin 322a, the first differential signal pin 321a, the second pin 322b, and the second differential signal pin 321b may form a rectangle. Therefore, the pin assembly 20 including the first pin 322a, the first differential signal pin 321a, the second pin 322b, and the second differential signal pin 321b is applicable to a ball grid array (BGA) arranged in a rectangle.

In this case, a direction of the connection line between the centers of the first differential signal pin 321a and the second differential signal pin 321b is used as a row, and a direction perpendicular to the connection line between the centers of the first differential signal pin 321a and the second differential signal pin 321b is used as a column. An arrangement of the first pin 322a, the first differential signal pin 321a, the second pin 322b, and the second differential signal pin 321b in the same pin assembly 20 is the same as the arrangement in the example 3.

In an embodiment, the first pin 322a is located in an $N^{th}$ row and an $M^{th}$ column. N≥1, M≥2, and N and M are positive integers. For example, the first pin 322a is located in a first row and a second column. The first differential signal pin 321a is located in an $(N+1)^{th}$ row and an $(M-1)^{th}$ column, and the second differential signal pin 321b is located in the $(N+1)^{th}$ row and an $(M+1)^{th}$ column. For example, the first differential signal pin 321a is located in a second row and a first column, and the second differential signal pin 321b is located in the second row and a third column. The second pin 322b is located in an $(N+2)^{th}$ row and the $M^{th}$ column. For example, the second pin 322b is located in a third row and the second column.

The third differential signal pin 323a in the third differential pin pair 313 is located in an $(N+3)^{th}$ row and the $(M-1)^{th}$ column, and the fourth differential signal pin 323b is located in the $(N+3)^{th}$ row and the $(M+1)^{th}$ column. For example, the third differential signal pin 323a is located in a fourth row and the first column, and the fourth differential signal pin 323b is located in the fourth row and the third column. The second pin 322a is located between the third differential signal pin 323a and the fourth differential signal pin 323b.

It should be noted that, in each of the foregoing examples, the pin assembly 20 including at least the first differential signal pin 321a, the second differential signal pin 321b, the first pin 322a, and the second pin 322b and located on one side of the chip 30 facing the packaging substrate 31 is used as an example to describe the pin arrangement of the pin assembly 20.

In other embodiments of this application, the pin arrangement of the pin assembly 20 is also applicable to the arrangement of a pin assembly 20 among the second-level pins 32b in the plurality of second-level pins 32b located on a surface of the packaging substrate 31 facing the PCB (e.g., FIG. 2b).

In this case, as shown in FIG. 2b, the chip 30 is electrically connected to the packaging substrate 31, and the pin assembly 20 in the plurality of second-level pins 32b is located on one side of the packaging substrate 31 away from the chip 30.

Based on this, to further reduce adverse impact of the voltage between the first pin 322a and the second pin 322b in the plurality of second-level pins 32b on the differential signal transmitted by the first differential pin pair 311, an internal structure of the PCB electrically connected to the first pin 322a and the second pin 322b, and the first differential signal pin 321a and the second differential signal pin 321b in the first differential pin pair 311 is disposed in the same way as the internal structure of the packaging substrate 31.

Figure 11:
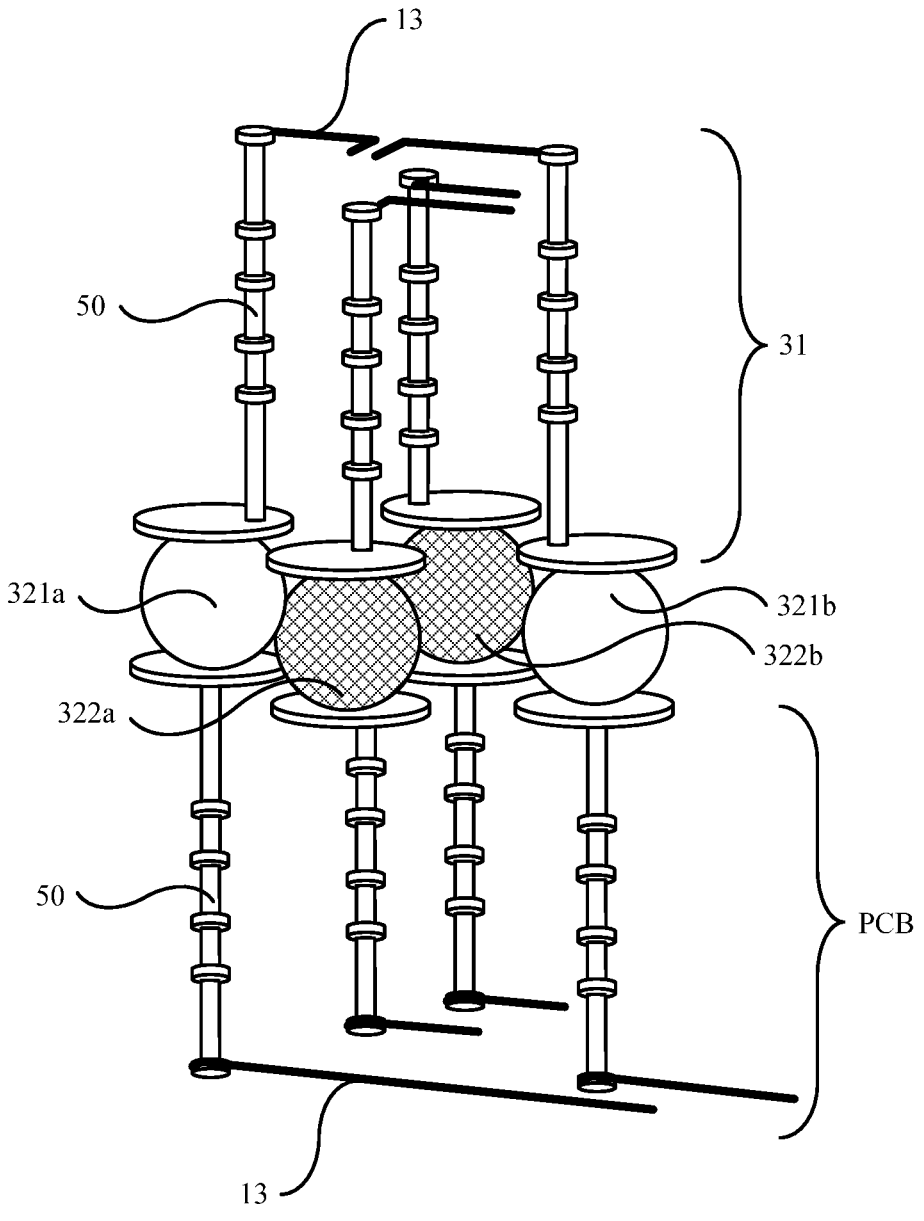
* and FIG. 11 is an example three-dimensional schematic diagram of an internal structure of a packaging substrate and a PCB that are electrically connected to a plurality of pins.

For example, as shown in FIG. 11 (a three-dimensional diagram of the internal structure of the packaging substrate 31 and the PCB), at least one insulation layer exists between a line 13 electrically connected to the first pin 322a and the second pin 322b through a via 50 in the packaging substrate 31, and a line 13 electrically connected to the first differential signal pin 321a and the second differential signal pin 321b through a via 50 in the packaging substrate 31. Therefore, lines of the first pin 322a, the second pin 322b, the first differential signal pin 321a, and the second differential signal pin 321b are led out from different layers in the packaging substrate 31, and adverse impact of the first pin 322a and the second pin 322b on the differential signal of the first differential pin pair constituted by the first differential signal pin 321a and the second differential signal pin 321b is reduced.

In addition, at least one insulation layer exists between a line 13 electrically connected to the first pin 322a and the second pin 322b through a via 50 in the PCB, and a line 13 electrically connected to the first differential signal pin 321a and the second differential signal pin 321b through a via 50 in the PCB. Therefore, the lines of the first pin 322a, the second pin 322b, the first differential signal pin 321a, and the second differential signal pin 321b can be led out from different layers in the PCB, and adverse impact of the first pin 322a and the second pin 322b on the differential signal of the first differential pin pair constituted by the first differential signal pin 321a and the second differential signal pin 321b is reduced.

In addition, when the first pin 322a and the second pin 322b in the pin assembly 20 are loosely coupled, and the first differential signal pin 321a and the second differential signal pin 321b are tightly coupled, anti-pads of the tightly coupled first differential signal pin 321a and second differential signal pin 321b on the same ground plane in the PCB are disposed in the foregoing manner and may be interconnected. Therefore, an anti-pad of the first pin 322a and an anti-pad of the second pin 322b can be separated from each other on the same ground plane in the PCB using the interconnected anti-pads, to isolate the first differential pin pair 311 (including the first differential signal pin 321a and the second differential signal pin 321b) from the first pin 322a and the second pin 322b.

The foregoing descriptions are implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A chip packaging apparatus, comprising:
a first differential pin pair, wherein the first differential pin pair includes a first differential signal pin and a second differential signal pin;
a first pin; and
a second pin, wherein
the first pin and the second pin are located between the first differential signal pin and the second differential signal pin,
the first pin and the second pin are differential signal pins or the first pin and the second pin are power pins,
the first pin and the second pin are respectively located on two sides of a first imaginary straight line,
the first imaginary straight line connects the first differential signal pin to the second differential signal pin,
a first auxiliary line intersects the first imaginary straight line at a position of the first differential signal pin and along a direction perpendicular to the first imaginary straight line,
a second auxiliary line intersects the first imaginary straight line at a position of the second differential signal pin and along the direction perpendicular to the first imaginary straight line,
the first pin and the second pin are symmetrical about a first symmetrical point,
the first differential signal pin and the second differential signal pin are symmetrical about the first symmetrical point
a first included angle γ1 exists between a second imaginary straight line and a zero potential plane, the second imaginary straight line connects the first pin to the first symmetrical point and the zero potential plane, a second included angle γ2 exists between a third imaginary straight line and the zero potential plane, the third imaginary straight line connects the second pin to the first symmetrical point and the zero potential plane, a spacing, along a horizontal direction, between the first differential signal pin and the second differential signal pin is less than a spacing, along a vertical direction, between the first pin and the second pin, the first included angle γ1 is 5° to 15°, the second included angle γ2 is 5° to 15°, the first pin and the second pin form a second differential pin pair, and a differential signal transmitted by the first differential pin pair and the second differential pin pair do not interfere with each other.

2. The chip packaging apparatus of claim 1, further comprising:

a chip, wherein the first differential pin pair, the first pin, and the second pin are electrically connected to the chip.

3. The chip packaging apparatus of claim 1, further comprising:

a chip; and a packaging substrate, wherein the chip is electrically connected to the packaging substrate, and the first differential pin pair, the first pin, and the second pin are located on one side of the packaging substrate away from the chip.

4. The chip packaging apparatus of claim 1, further comprising:

a packaging substrate, wherein the packaging substrate includes:

at least one insulation layer, a first differential line electrically connected to the first differential signal pin, a second differential line electrically connected to the second differential signal pin, a first line electrically connected to the first pin, and a second line electrically connected to the second pin, wherein the at least one insulation layer exists between the first line and the first differential line and between the first line and the second differential line.

5. The chip packaging apparatus of claim 1, wherein a first spacing exists between the first pin and the first differential signal pin, a second spacing exists between the first pin and the second differential signal pin, a third spacing exists between the second pin and the first differential signal pin, a fourth spacing exists between the second pin and the second differential signal pin, and a fifth spacing exists between the first differential signal pin and the second differential signal pin, wherein the first, second, third, fourth, and fifth spacings are all equal.

6. The chip packaging apparatus of claim 5, further comprising:

a plurality of pins arranged in an array, wherein the plurality of pins includes the first pin, the first differential signal pin, the second differential signal pin, and the second pin, wherein the first pin is located in an $N^{th}$ row and an $M^{th}$ column, wherein N≥1, M≥2, and N and M are positive integers;

the first differential signal pin is located in an $(N+1)^{th}$ row and an $(M-1)^{th}$ column, and the second differential signal pin is located in the $(N+1)^{th}$ row and an $(M+1)^{th}$ column;

the second pin is located in an $(N+2)^{th}$ row and the $M^{th}$ column;

the plurality of pins arranged in the array further include a third differential signal pin, a fourth differential signal pin, a third pin, and a fourth pin, wherein the third pin and the fourth pin are located between the third differential signal pin and the fourth differential signal pin, and the third pin and the fourth pin are differential signal pins or power pins;

the third pin is adjacent to the third differential signal pin and the fourth differential signal pin, the fourth differential pin is adjacent to the third differential signal pin and the fourth differential signal pin, the third pin and the fourth pin are respectively located on two sides of a fourth imaginary straight line, and the fourth imaginary straight line connects the third differential signal pin to the fourth differential signal pin;

the third pin is located in an $(N+3)^{th}$ row and an $(M+3)^{th}$ column;

the third differential signal pin is located in an $(N+4)^{th}$ row and an $(M+2)^{th}$ column, and the fourth differential signal pin is located in the $(N+4)^{th}$ row and an $(M+4)^{th}$ column;

the fourth pin is located in an $(N+5)^{th}$ row and the $(M+3)^{th}$ column; and the plurality of pins arranged in the array further include a ground pin located in the $(N+2)^{th}$ row and the $(M+2)^{th}$ column, and a ground pin located in the $(N+3)^{th}$ row and the $(M+1)^{th}$ column.

7. The chip packaging apparatus of claim 5, further comprising:

a plurality of pins arranged in an array, wherein the plurality of pins arranged in the array include the first pin, the first differential signal pin, the second differential signal pin, and the second pin, wherein the first pin is located in an $N^{th}$ row and an $M^{th}$ column, wherein N≥1, M≥2, and N and M are positive integers;

the first differential signal pin is located in an $(N+1)^{th}$ row and an $(M-1)^{th}$ column, and the second differential signal pin is located in the $(N+1)^{th}$ row and an $(M+1)^{th}$ column;

the second pin is located in an $(N+2)^{th}$ row and the $M^{th}$ column;

the plurality of pins arranged in the array further include a third differential signal pin, a fourth differential signal pin, a third pin, and a fourth pin, wherein the third pin and the fourth pin are located between the third differential signal pin and the fourth differential signal pin, and the third pin and the fourth pin are differential signal pins or power pins;

the third pin is adjacent to the third differential signal pin and the fourth differential signal pin, the fourth differential pin is adjacent to the third differential signal pin and the fourth differential signal pin, the third pin and the fourth pin are respectively located on two sides of a fourth imaginary straight line, and the fourth imaginary straight line connects the third differential signal pin to the fourth differential signal pin;

the third pin is located in the $(N+2)^{th}$ row and an $(M+4)^{th}$ column;

the third differential signal pin is located in an $(N+3)^{th}$ row and an $(M+3)^{th}$ column, and the fourth differential signal pin is located in the $(N+3)^{th}$ row and an $(M+5)^{th}$ column;

the fourth pin is located in an $(N+4)^{th}$ row and the $(M+4)^{th}$ column; and the plurality of pins arranged in the array further include a ground pin located in the $(N+2)^{th}$ row and an $(M+2)^{th}$ column.

8. The chip packaging apparatus of claim 5, further comprising:

a plurality of pins arranged in an array, wherein the plurality of pins arranged in the array include the first pin, the first differential signal pin, the second differential signal pin, and the second pin, wherein the first pin is located in an $N^{th}$ row and an $M^{th}$ column, wherein $N \geq 1$, $M \geq 2$, and N and M are positive integers;

the first differential signal pin is located in an $(N+1)^{th}$ row and an $(M-1)^{th}$ column, and the second differential signal pin is located in the $(N+1)^{th}$ row and an $(M+1)^{th}$ column;

the second pin is located in an $(N+2)^{th}$ row and the $M^{th}$ column, and the first pin and the second pin are ground pins;

the plurality of pins arranged in the array further include a third differential signal pin and a fourth differential signal pin, wherein the second pin is located between the third differential signal pin and the fourth differential signal pin and is adjacent to the third differential signal pin and the fourth differential signal pin; and the third differential signal pin is located in an $(N+3)^{th}$ row and the $(M-1)^{th}$ column, and the fourth differential signal pin is located in the $(N+3)^{th}$ row and the $(M+1)^{th}$ column.

9. The chip packaging apparatus of claim 1, further comprising:

a packaging substrate, wherein the packaging substrate includes:

a first differential via electrically connected to the first differential signal pin;

a second differential via electrically connected to the second differential signal pin; and a ground plane, wherein a first anti-pad of the first differential via and a second anti-pad of the second differential via on the ground plane are interconnected.

10. The chip packaging apparatus of claim 1, wherein a first spacing exists between the first pin and the first differential signal pin, a second spacing exists between the first differential signal pin and the second pin, a third spacing exists between the second pin and the second differential signal pin, and a fourth spacing exists between the second differential signal pin and the first pin, wherein the first, second, third, and fourth spacings are all equal.

11. The chip packaging apparatus of claim 1, wherein the first differential signal pin, the second differential signal pin, the first pin, and the second pin are in a first pin assembly, and another first differential signal pin, second differential signal pin, first pin, and second pin are in a second pin assembly, two ground pins are positioned, along a first row, between the first pin of the first pin assembly and the first pin of the second pin assembly, and one ground pin is positioned, along a second row, between the second differential signal pin of the first pin assembly and the first differential signal pin of the second pin assembly.

12. The chip packaging apparatus of claim 11, wherein two ground pins are positioned, along a third row, between the second pin of the first pin assembly and the second pin of the second pin assembly.

13. A chip packaging apparatus, comprising:

a first differential pin pair, wherein the first differential pin pair includes a first differential signal pin and a second differential signal pin;

a first pin; and a second pin, wherein the first pin and the second pin are located between the first differential signal pin and the second differential signal pin, the first pin and the second pin are differential signal pins or the first pin and the second pin are power pins, the first pin and the second pin are respectively located on two sides of a first imaginary straight line, the first imaginary straight line connects the first differential signal pin to the second differential signal pin, and the first pin and the second pin are symmetrically disposed about the first imaginary straight line, the first pin and the second pin are symmetrical about a first symmetrical point, the first differential signal pin and the second differential signal pin are symmetrical about the first symmetrical point a first included angle γ1 exists between a second imaginary straight line and a zero potential plane, the second imaginary straight line connects the first pin to the first symmetrical point and the zero potential plane, a second included angle γ2 exists between a third imaginary straight line and the zero potential plane, the third imaginary straight line connects the second pin to the first symmetrical point and the zero potential plane, and a spacing, along a horizontal direction, between the first differential signal pin and the second differential signal pin is less than a spacing, long a vertical direction, between the first pin and the second pin.

14. The chip packaging apparatus of claim 13, wherein the first differential signal pin, the second differential signal pin, the first pin, and the second pin are in a first pin assembly, and another first differential signal pin, second differential signal pin, first pin, and second pin are in a second pin assembly, two ground pins are positioned, along a first row, between the first pin of the first pin assembly and the first pin of the second pin assembly, and one ground pin is positioned, along a second row, between the second differential signal pin of the first pin assembly and the first differential signal pin of the second pin assembly.

15. The chip packaging apparatus of claim 14, wherein two ground pins are positioned, along a third row, between the second pin of the first pin assembly and the second pin of the second pin assembly.

* * * * *